United States Patent
Soeta

(10) Patent No.: US 12,272,856 B2
(45) Date of Patent: Apr. 8, 2025

(54) MULTI-LAYER SIGNAL TRANSMISSION LINE INCLUDING A VOID OF SPECIFIED DIMENSIONS AND METHOD FOR MANUFACTURE

(71) Applicant: Murata Manufacturing Co., Ltd., Nagaokakyo (JP)

(72) Inventor: Yushi Soeta, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 280 days.

(21) Appl. No.: 17/971,671

(22) Filed: Oct. 24, 2022

(65) Prior Publication Data

US 2023/0038684 A1     Feb. 9, 2023

Related U.S. Application Data

(63) Continuation of application No. PCT/JP2021/015484, filed on Apr. 14, 2021.

(30) Foreign Application Priority Data

May 12, 2020    (JP) ................................. 2020-083980

(51) Int. Cl.
H01P 3/08       (2006.01)

(52) U.S. Cl.
CPC ............... *H01P 3/082* (2013.01); *H01P 3/08* (2013.01); *H01P 3/085* (2013.01); *H01P 3/088* (2013.01)

(58) Field of Classification Search
CPC ........... H01P 3/082; H01P 3/088; H01P 3/085
(Continued)

(56) References Cited

U.S. PATENT DOCUMENTS 6,020,798 A    2/2000   Nakakubo et al.
9,583,836 B2 *   2/2017   Kato et al. ................ H01P 1/02
(Continued)

FOREIGN PATENT DOCUMENTS

JP     53-127170 U    10/1978
JP     S62269401 A    11/1987
(Continued)

OTHER PUBLICATIONS

International Search Report in PCT/JP2021/015484, mailed Jun. 29, 2021, 4 pages.
(Continued)

*Primary Examiner* — Benny T Lee
(74) *Attorney, Agent, or Firm* — Keating & Bennett, LLP

(57) ABSTRACT

A conductor non-formed portion where no conductor layer exists is provided in a first ground conductor layer. A multilayer body is provided with a void where no insulating resin exists. At least a portion of the conductor non-formed portion is provided in a first area positioned at a right of a first interlayer connection conductor with respect to a multilayer body left-right direction and at left of a second interlayer connection conductor with respect to the multilayer body left-right direction in a view in a multilayer body downward direction. At least a portion of a void overlaps with the conductor non-formed portion in the view in the multilayer body downward direction and is provided above a first signal conductor layer with respect to a multilayer body up-down direction and below the first ground conductor layer with respect to the multilayer body up-down direction.

20 Claims, 14 Drawing Sheets

(58) Field of Classification Search
USPC .......................................................... 333/238
See application file for complete search history.

(56) References Cited

U.S. PATENT DOCUMENTS

| 9,899,719 B2 * | 2/2018 | Yosui ...................... H01P 3/085 |
| 2015/0015345 A1 | 1/2015 | Sasaki et al. |
| 2015/0207221 A1 | 7/2015 | Iso et al. |
| 2015/0305142 A1 * | 10/2015 | Matsuda .............. H05K 3/0052 |
| | | 29/601 |
| 2018/0309182 A1 | 10/2018 | Iida et al. |
| 2021/0288390 A1 * | 9/2021 | Tago ........................ H05K 1/02 |

FOREIGN PATENT DOCUMENTS

| JP | H1098315 A | 4/1998 |
| JP | 2000201008 A | 7/2000 |
| JP | 2007201263 A | 8/2007 |
| JP | 2015139051 A | 7/2015 |
| JP | 2016164882 A | 9/2016 |
| JP | 2016201370 A | 12/2016 |
| JP | 2018121076 A | 8/2018 |
| WO | 2017130731 A1 | 8/2017 |

OTHER PUBLICATIONS

Written Opinion in PCT/JP2021/015484, mailed Jun. 29, 2021, 4 pages.

* cited by examiner

Fig.13
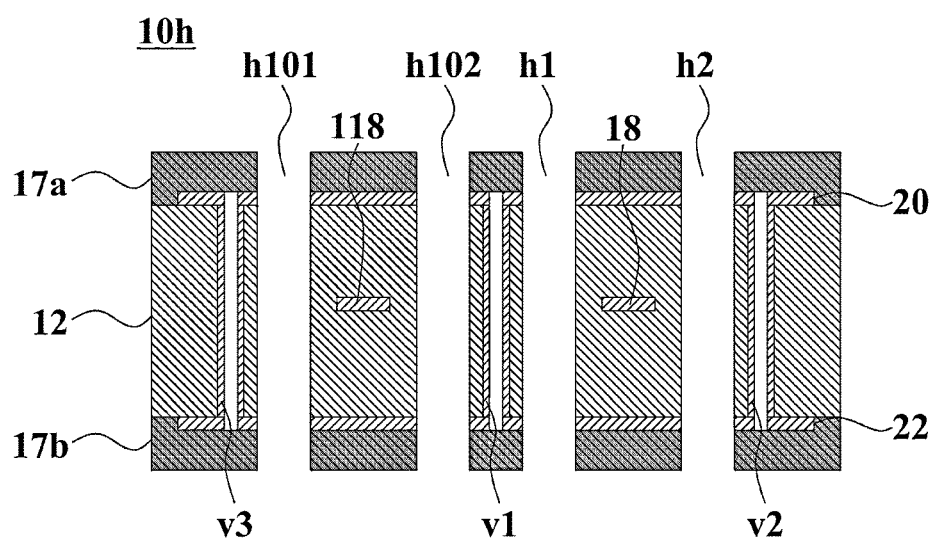
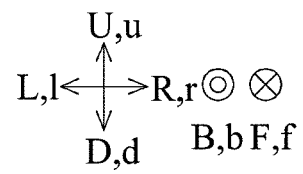

MULTI-LAYER SIGNAL TRANSMISSION LINE INCLUDING A VOID OF SPECIFIED DIMENSIONS AND METHOD FOR MANUFACTURE

CROSS REFERENCE TO RELATED APPLICATIONS

This application is a Continuation Application of PCT Application No. PCT/JP2021/015484, filed on Apr. 14, 2021, through which this application claims the benefit of priority to Japanese Patent Application No. 2020-083980, filed on May 12, 2020. The entire contents of each application are hereby incorporated herein by reference.

BACKGROUND OF THE INVENTION

1. Field of the Invention

The present invention relates to a signal transmission line including a signal conductor layer and a ground conductor layer.

2. Description of the Related Art

As an invention concerning a conventional signal transmission line, a signal transmission line disclosed in International Publication No. 2017/130731 has been known, for instance. The signal transmission line disclosed in International Publication No. 2017/130731 includes a multilayer body, a signal conductor, a first ground conductor, and a second ground conductor. The multilayer body has a structure in which a plurality of resin sheets are laminated in an up-down direction. The multilayer body has flexibility. The signal conductor, the first ground conductor, and the second ground conductor are provided in or on the multilayer body. The first ground conductor is placed above the signal conductor. The second ground conductor is placed below the signal conductor. Thus, the signal conductor, the first ground conductor, and the second ground conductor have a stripline structure. Meanwhile, a void is provided between the first ground conductor and the signal conductor in the multilayer body. Similarly, a void is provided between the second ground conductor and the signal conductor in the multilayer body. Thus, occurrence of dielectric loss is reduced in the signal transmission line disclosed in International Publication No. 2017/130731. Such a signal transmission line as disclosed in International Publication No. 2017/130731 is used in a state in which the signal transmission line is curved in the up-down directions.

Meanwhile, in the signal transmission line disclosed in International Publication No. 2017/130731, characteristic impedance of the signal transmission line changes. More particularly, the void is provided between the first ground conductor and the signal conductor. Therefore, the void overlaps with the first ground conductor and the signal conductor in a view in a downward direction. When the void is distorted, in this case, a distance between the first ground conductor and the signal conductor changes. Then, a capacitance value between the first ground conductor and the signal conductor changes. As a result, the characteristic impedance of the signal transmission line changes.

SUMMARY OF THE INVENTION

Preferred embodiments of the present invention provide signal transmission lines by each which a change in characteristic impedance of the signal transmission line can be reduced.

A signal transmission line according to a preferred embodiment of the present invention includes a multilayer body having a structure in which insulating resin layers are laminated in a multilayer body up-down direction, a first signal conductor layer in the multilayer body, the first signal conductor layer extending in a multilayer body front-back direction, a first ground conductor layer on the multilayer body, the first ground conductor layer being above the first signal conductor layer with respect to the multilayer body up-down direction to overlap with the first signal conductor layer in a view in a multilayer body downward direction, a second ground conductor layer on the multilayer body, the second ground conductor layer being below the first signal conductor layer with respect to the multilayer body up-down direction to overlap with the first signal conductor layer in the view in the multilayer body downward direction, a first interlayer connection conductor in the multilayer body and positioned at a left of the first signal conductor layer with respect to a multilayer body left-right direction, the first interlayer connection conductor making an electrical connection between the first ground conductor layer and the second ground conductor layer, and a second interlayer connection conductor in the multilayer body and positioned at a right of the first signal conductor layer with respect to the multilayer body left-right direction, the second interlayer connection conductor making an electrical connection between the first ground conductor layer and the second ground conductor layer.

A conductor non-formed portion where no conductor layer exists is provided in the first ground conductor layer. The multilayer body includes a void where no insulating resin exists. At least a portion of the conductor non-formed portion is in a first area positioned at a right of the first interlayer connection conductor with respect to the multilayer body left-right direction and at left of the second interlayer connection conductor with respect to the multilayer body left-right direction in the view in the multilayer body downward direction. At least a portion of the void overlaps with the conductor non-formed portion in the first area in the view in the multilayer body downward direction and is above the first signal conductor layer with respect to the multilayer body up-down direction and below the first ground conductor layer with respect to the multilayer body up-down direction. An interlayer connection conductor that makes an electrical connection between the first ground conductor layer and the second ground conductor layer is not provided in the first area.

Hereinbelow, definitions of terms in this disclosure will be described. In the specification, axes and structures that extend in a front-back direction do not necessarily designate only axes and structures that are parallel or substantially parallel to the front-back direction. The axes and structures that extend in the front-back direction designate axes and structures that are slanted in a range of about ±45° relative to the front-back direction. Similarly, axes and structures that extend in an up-down direction designate axes and structures that are slanted in a range of about ±45° relative to the up-down direction. Axes and structures that extend in a left-right direction designate axes and structures that are slanted in a range of about ±45° relative to the left-right direction.

Hereinbelow, a first portion to a third portion denote structures or the like included in a signal transmission line. In this disclosure, portions of the first portion are defined as follows, unless otherwise noted. A front portion of the first portion denotes a front half of the first portion. A back portion of the first portion denotes a back half of the first portion. A left portion of the first portion denotes a left half of the first portion. A right portion of the first portion denotes a right half of the first portion. An upper portion of the first portion denotes an upper half of the first portion. A lower portion of the first portion denotes a lower half of the first portion. A front end of the first portion denotes an end of the first portion in a frontward direction. A back end of the first portion denotes an end of the first portion in a backward direction. A left end of the first portion denotes an end of the first portion in a leftward direction. A right end of the first portion denotes an end of the first portion in a rightward direction. An upper end of the first portion denotes an end of the first portion in an upward direction. A lower end of the first portion denotes an end of the first portion in a downward direction. A front end portion of the first portion denotes the front end and vicinities thereof of the first portion. A back end portion of the first portion denotes the back end and vicinities thereof of the first portion. A left end portion of the first portion denotes the left end and vicinities thereof of the first portion. A right end portion of the first portion denotes the right end and vicinities thereof of the first portion. An upper end portion of the first portion denotes the upper end and vicinities thereof of the first portion. A lower end portion of the first portion denotes the lower end and vicinities thereof of the first portion.

In a case where any two structures in this disclosure are defined as the first portion and the second portion, relationships between the two structures respectively designate such meanings as follows. In the specification, support for the first portion by the second portion encompasses a case where the first portion is immovably attached (that is, fixed) to the second portion and a case where the first portion is movably attached to the second portion. Additionally, the support for the first portion by the second portion encompasses both of a case where the first portion is directly attached to the second portion and a case where the first portion is attached to the second portion with a third portion interposed therebetween.

In this disclosure, fixation of the first portion to the second portion encompasses a case where the first portion is immovably attached to the second portion and does not encompass a case where the first portion is movably attached to the second portion. Additionally, the fixation of the first portion to the second portion encompasses both of the case where the first portion is directly attached to the second portion and the case where the first portion is attached to the second portion with the third portion interposed therebetween.

In this disclosure, "the first portion is electrically connected to the second portion" means that a direct current can flow between the first portion and the second portion. Accordingly, the first portion may be in contact with the second portion or the first portion may be out of contact with the second portion. In a case where the first portion is out of contact with the second portion, the third portion having conductivity is provided between the first portion and the second portion.

With the signal transmission lines according to preferred embodiments of the present invention, a change in the characteristic impedance of the signal transmission line can be reduced.

The above and other elements, features, steps, characteristics and advantages of the present invention will become more apparent from the following detailed description of the preferred embodiments with reference to the attached drawings, where like features are denoted by the same reference label throughout the detailed description of the drawings.

BRIEF DESCRIPTION OF THE DRAWINGS

FIG. 13 is a sectional view of a signal transmission line according to a preferred embodiment of the present invention.

DETAILED DESCRIPTION OF THE PREFERRED EMBODIMENTS

Hereinbelow, preferred embodiments of the present invention will be described with respect to directions shown in the attached drawings. Throughout the attached drawings (e.g., FIGS. 1-3, 4B, 5, 6B, 7B, 8-14), the directions include an up direction U, a down direction D, a left direction L, a right direction R, a front direction F, a back direction B, an up-down direction UD, a front-back direction FB, a left-right direction LR, a multilayer body up direction u, a multilayer body down direction d, a multilayer body left direction I, a multilayer body right direction r, a multilayer body front direction f, a multilayer body back direction b, a multilayer body up-down direction ud, a multilayer body left-right direction lr, and a multilayer body front-back direction fb.

Preferred Embodiment

Structure of Signal Transmission Line

Hereinbelow, a structure of a signal transmission line 10 according to a preferred embodiment of the present invention will be described with reference to the drawings. FIG.

Figure 2:
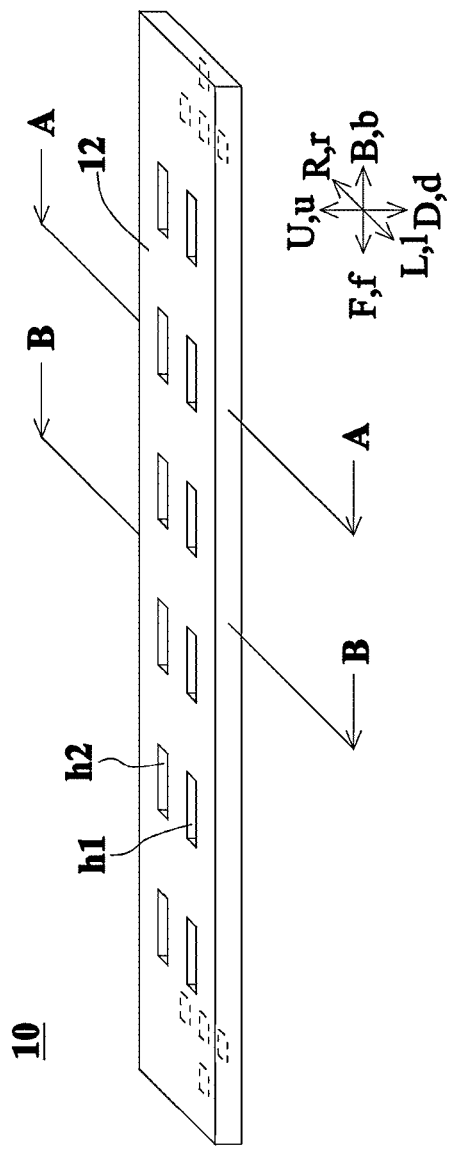
FIG. 2 is a perspective outline view of a signal transmission line according to a preferred embodiment of the present invention.
Figure 3:
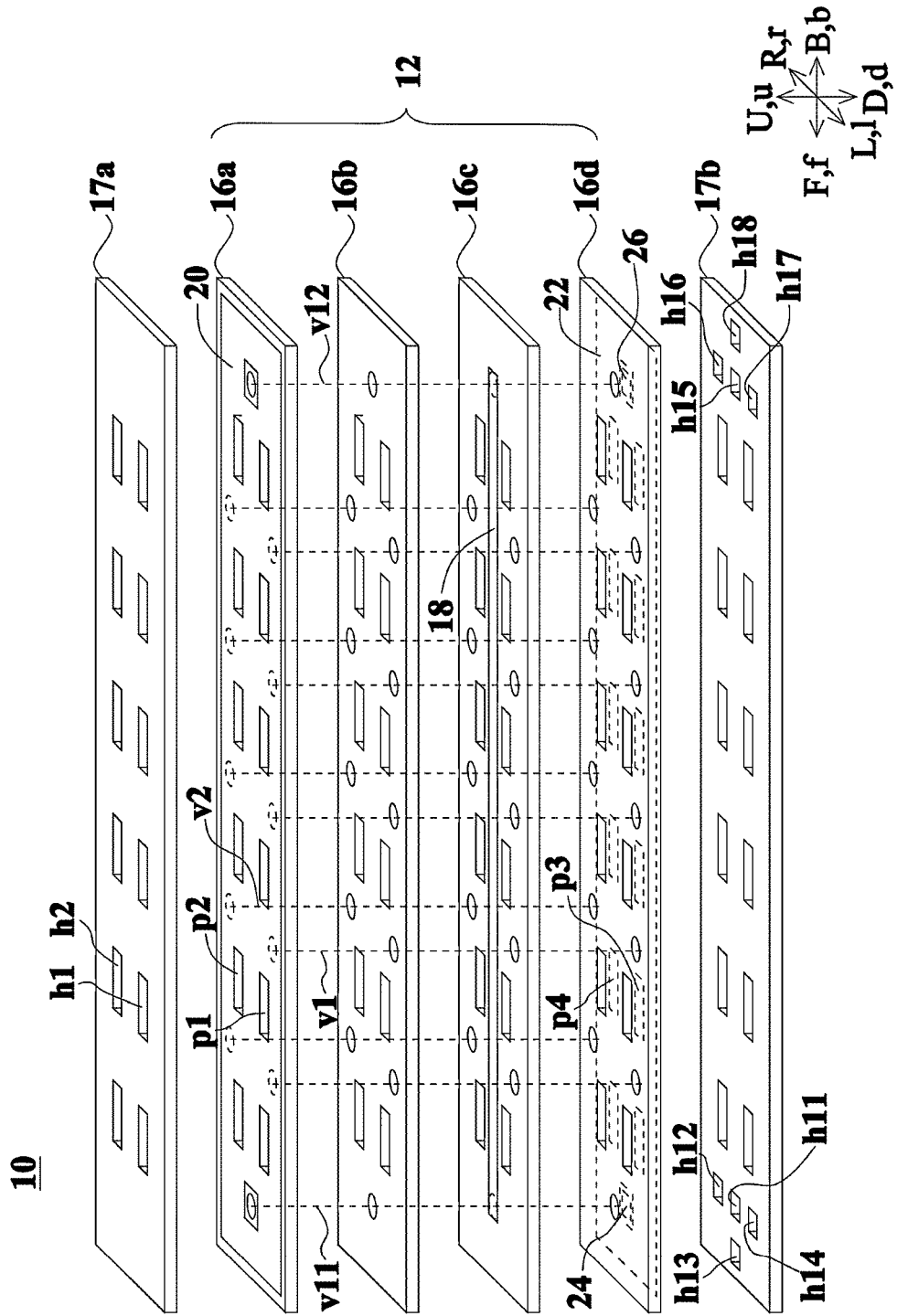
FIG. 3 is an exploded perspective view of the signal transmission line according to a preferred embodiment of the present invention.
Figure 4A:
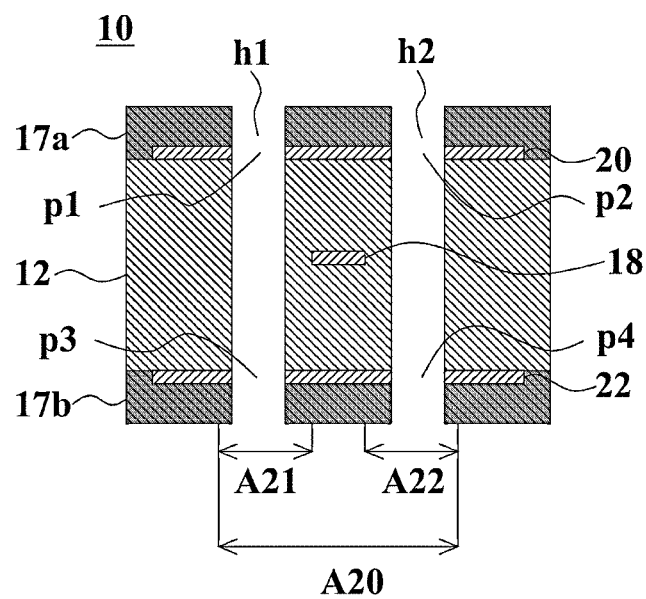
FIG. 4A is a sectional view taken along line A-A of FIG. 2.
Figure 4B:
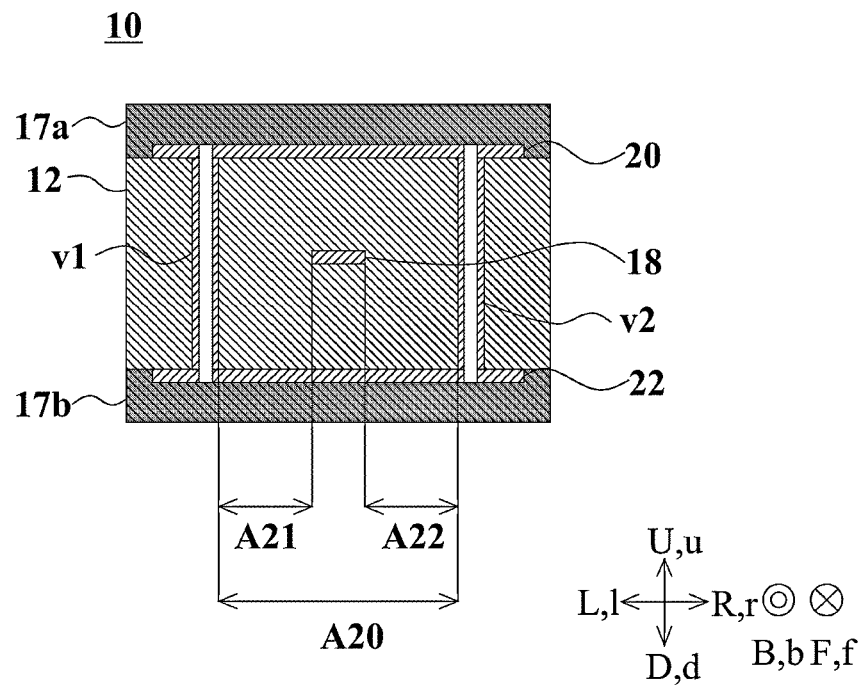
FIG. 4B is a sectional view taken along line B-B of FIG. 2.

1 is an elevational view of an electronic device 1. FIG. 2 is a perspective outline view of the signal transmission line 10. FIG. 3 is an exploded perspective view of the signal transmission line 10. FIG. 4A is a sectional view taken along line A-A of FIG. 2. FIG. 4B is a sectional view taken along line B-B of FIG. 2.

Figure 1:
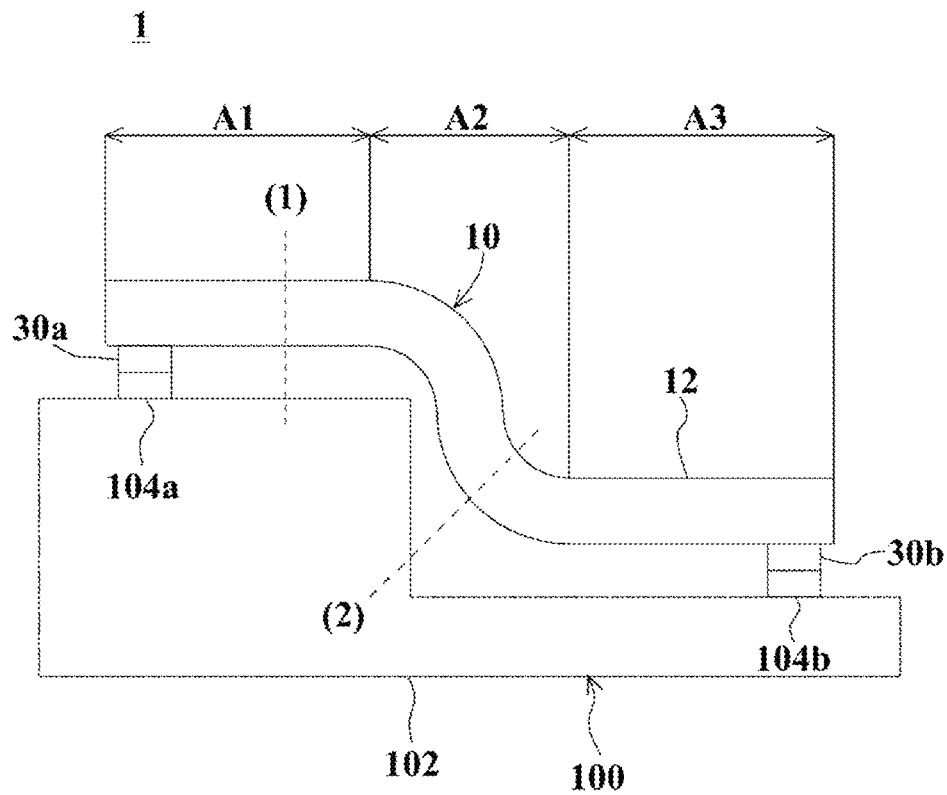
FIG. 1 is an elevational view of an electronic device according to a preferred embodiment of the present invention.

As illustrated in FIG. 1, the signal transmission line 10 is used to connect two circuits in the electronic device 1 such as a cellular phone. Additionally, the signal transmission line 10 is curved in up-down directions to be used, as illustrated in FIG. 1. Accordingly, the signal transmission line 10 preferably includes non-curved sections A1, A3 and a curved section A2. The non-curved sections A1, A3 are sections where the signal transmission line 10 is not curved in the up-down directions. The curved section A2 is a section where the signal transmission line 10 is curved in the up-down directions. The non-curved section A1 is positioned at a left of the curved section A2. The non-curved section A1 adjoins the curved section A2. The non-curved section A3 is positioned at a right of the curved section A2. The non-curved section A3 adjoins the curved section A2.

Herein, directions are defined in this disclosure as follows. A laminating direction of a multilayer body 12 of the signal transmission line 10 is defined as a multilayer body up-down direction. A direction in which a first signal conductor layer 18 of the signal transmission line 10 extends is defined as a multilayer body front-back direction. A line width direction of the first signal conductor layer 18 of the signal transmission line 10 is defined as a multilayer body left-right direction. The multilayer body up-down direction, the multilayer body front-back direction, and the multilayer body left-right direction are orthogonal or substantially orthogonal to one another.

As illustrated in FIG. 1, however, the signal transmission line 10 is curved in the up-down directions. Accordingly, the multilayer body up-down direction and the multilayer body front-back direction vary according to positions in the signal transmission line 10, as illustrated in FIG. 1. In the non-curved sections A1, A3 where the multilayer body 12 is not bent (at position (1), for instance), the multilayer body up-down direction and the multilayer body front-back direction respectively coincide with the up-down direction and a front-back direction. Meanwhile, in the curved section A2 where the multilayer body 12 is bent (at position (2), for instance), the multilayer body up-down direction and the multilayer body front-back direction do not coincide with the up-down direction and the front-back direction, respectively. Definitions of the directions in this disclosure represent an example. Accordingly, the directions at time when the signal transmission line 10 is actually used do not have to coincide with the directions in the specification.

The signal transmission line 10 is preferably used to connect two circuits in an electronic device such as a cellular phone, for instance. As illustrated in FIGS. 2 and 3, the signal transmission line 10 includes a multilayer body 12, resist layers 17a, 17b, a first signal conductor layer 18, a first ground conductor layer 20, a second ground conductor layer 22, outer electrodes 24, 26, a first interlayer connection conductors v1, a second interlayer connection conductors v2, and interlayer connection conductors v11, v12.

Incidentally, in FIGS. 2 and 3, reference characters are provided for representative interlayer connection conductors, conductor non-formed portions, and voids among the first interlayer connection conductors v1, the second interlayer connection conductors v2, a conductor non-formed portions p1, p2, and a voids h1, h2.

The multilayer body 12 preferably has a plate shape. As illustrated in FIG. 2, the multilayer body 12 has a rectangular or substantially rectangular shape that includes long sides extending in the multilayer body front-back direction in a view in a multilayer body downward direction. Accordingly, a length of the multilayer body 12 in the multilayer body front-back direction is longer than a length of the multilayer body 12 in the multilayer body left-right direction. The length of the multilayer body 12 in the multilayer body front-back direction is longer than a length of the multilayer body 12 in the multilayer body up-down direction. The multilayer body 12 has flexibility. Accordingly, the multilayer body 12 is used in the electronic device 1 in a state in which the multilayer body 12 is curved in the up-down directions.

As illustrated in FIG. 3, the multilayer body 12 includes a structure in which insulating resin layers 16a, 16b, 16c, and 16d are laminated in the multilayer body up-down direction. The insulating resin layers 16a to 16d are laminated to be arranged in this order from upside toward downside in the multilayer body up-down direction. The insulating resin layers 16a to 16d are dielectric sheets having flexibility. Material of the insulating resin layers 16a to 16d is preferably, for example, thermoplastic resin such as polyimide or liquid crystal polymer. In the view in the multilayer body downward direction, the insulating resin layers 16a to 16d have the same or substantially the same rectangular or substantially rectangular shape as the multilayer body 12.

The first signal conductor layer 18 is provided in the multilayer body 12 as illustrated in FIG. 3. More particularly, the first signal conductor layer 18 is provided on a top surface of the insulating resin layer 16c. Thus, the first signal conductor layer 18 is provided in the multilayer body 12. The first signal conductor layer 18 has a linear shape extending in the multilayer body front-back direction. The first signal conductor layer 18 is provided at center with respect to the multilayer body left-right direction on the top surface of the insulating resin layer 16c. A front end of the first signal conductor layer 18 is positioned on a front end portion of the insulating resin layer 16c. A back end of the first signal conductor layer 18 is positioned on a back end portion of the insulating resin layer 16c. High-frequency signals are transmitted through the first signal conductor layer 18.

The first ground conductor layer 20 is provided on the multilayer body 12. The first ground conductor layer 20 is provided above the first signal conductor layer 18 with respect to the multilayer body up-down direction to overlap with the first signal conductor layer 18 in the view in the multilayer body downward direction. In this disclosure, "the first ground conductor layer 20 is provided above the first signal conductor layer 18 with respect to the multilayer body up-down direction" means a state to be described below. At least a portion of the first ground conductor layer 20 is provided in an area where the first signal conductor layer 18 extends when viewed in the multilayer body up-down direction. Accordingly, the first ground conductor layer 20 may fit into the area where the first signal conductor layer 18 extends when viewed in the multilayer body up-down direction or may extend outside of the area where the first signal conductor layer 18 extends when viewed in the multilayer body up-down direction. In the present preferred embodiment, the first ground conductor layer 20 protrudes from the area where the first signal conductor layer 18 extends when viewed in the multilayer body up-down direction.

The first ground conductor layer 20 is provided on a top surface of the insulating resin layer 16a. As illustrated in FIG. 3, the first ground conductor layer 20 has a rectangular or substantially rectangular shape that includes long sides extending in the multilayer body front-back direction in the view in the multilayer body downward direction. In the view in the multilayer body downward direction, the first ground conductor layer 20 has the shape that substantially coincides with the multilayer body 12. The first ground conductor layer 20, however, is slightly smaller than the multilayer body 12, in the view in the multilayer body downward direction. A ground potential is connected to the first ground conductor layer 20.

The second ground conductor layer 22 is provided on the multilayer body 12. The second ground conductor layer 22 is provided below the first signal conductor layer 18 to overlap with the first signal conductor layer 18 in the view in the multilayer body downward direction. More particularly, the second ground conductor layer 22 is provided on a bottom surface of the insulating resin layer 16d. As illustrated in FIG. 3, the second ground conductor layer 22 has a rectangular shape that has long sides extending in the multilayer body front-back direction in the view in the multilayer body downward direction. In the view in the multilayer body downward direction, the second ground conductor layer 22 has the shape that substantially coincides with the multilayer body 12. The second ground conductor layer 22, however, is slightly smaller than the multilayer body 12, in the view in the multilayer body downward direction. A ground potential is connected to the second ground conductor layer 22. The first signal conductor layer 18, the first ground conductor layer 20, and the second ground conductor layer 22 as described above have strip-line structures.

The outer electrode 24 is provided on a bottom surface of a left end portion of the insulating resin layer 16d. The outer electrode 24 has a rectangular or substantially rectangular shape in the view in the multilayer body downward direction. The second ground conductor layer 22 is not provided around the outer electrode 24 so that the outer electrode 24 is insulated from the second ground conductor layer 22. The outer electrode 24 overlaps with a front end portion of the first signal conductor layer 18 in the view in the multilayer body downward direction. The high-frequency signals are inputted or outputted via the outer electrode 24 into or from the first signal conductor layer 18. The outer electrode 26 has a structure that is in front-back symmetry to the outer electrode 24. Therefore, description of the outer electrode 26 is omitted.

The resist layers 17a, 17b are protective layers having flexibility. The resist layers 17a, 17b preferably have the same or substantially the same rectangular shape as the multilayer body 12, in the view in the multilayer body downward direction. The resist layers 17a, 17b are not portions of the multilayer body 12.

The resist layer 17a covers the entire or substantially the entire top surface of the insulating resin layer 16a. Thus, the resist layer 17a protects the first ground conductor layer 20.

The resist layer 17b covers the entire or substantially the entire bottom surface of the insulating resin layer 16d. Thus, the resist layer 17b protects the second ground conductor layer 22. On the resist layer 17b, however, openings h11, h12, h13, h14, h15, h16, h17, and h18 are provided. The opening h11 overlaps with the outer electrode 24 in the view in the multilayer body downward direction. Thus, the outer electrode 24 is exposed from the signal transmission line 10 through the opening h11. The opening h12 is provided at right of the opening h11 with respect to the multilayer body left-right direction. The opening h13 is provided in front of the opening h11 with respect to the multilayer body front-back direction. The opening h14 is provided at left of the opening h11 with respect to the multilayer body left-right direction. Thus, the second ground conductor layer 22 is exposed from the signal transmission line 10 through the openings h12 to h14. Incidentally, the openings h15 to h18 respectively have structures that are in front-back symmetry to the openings h11 to h14. Therefore, description of the openings h15 to h18 is omitted.

The first signal conductor layer 18, the first ground conductor layer 20, the second ground conductor layer 22, and the outer electrodes 24, 26 as described above are preferably formed by, for example, etching on copper foil provided on the top surfaces or the bottom surfaces of the insulating resin layers 16a to 16d, for instance.

The first interlayer connection conductors v1 are provided in the multilayer body 12 to be positioned at a left of the first signal conductor layer 18 with respect to the multilayer body left-right direction. The first interlayer connection conductors v1 are provided to be arranged in a line at equal intervals along the multilayer body front-back direction. The first interlayer connection conductors v1 penetrate the insulating resin layers 16a to 16d in the up-down direction. Upper ends of the first interlayer connection conductors v1 are connected to the first ground conductor layer 20. Lower ends of the first interlayer connection conductors v1 are connected to the second ground conductor layer 22. Thus, the first interlayer connection conductors v1 make electrical connections between the first ground conductor layer 20 and the second ground conductor layer 22.

The second interlayer connection conductors v2 are provided in the multilayer body 12 to be positioned at a right of the first signal conductor layer 18 with respect to the multilayer body left-right direction. The second interlayer connection conductors v2 are provided to be arranged in a line at equal intervals along the multilayer body front-back direction. The second interlayer connection conductors v2 penetrate the insulating resin layers 16a to 16d in the up-down direction. Upper ends of the second interlayer connection conductors v2 are connected to the first ground conductor layer 20. Lower ends of the second interlayer connection conductors v2 are connected to the second ground conductor layer 22. Thus, the second interlayer connection conductors v2 make electrical connections between the first ground conductor layer 20 and the second ground conductor layer 22.

The interlayer connection conductor v11 is provided in front end portions of the insulating resin layers 16a to 16d. The interlayer connection conductor v11 penetrates the insulating resin layers 16a to 16d in the up-down direction. A middle portion of the interlayer connection conductor v11 is connected to the front end portion of the first signal conductor layer 18. A lower end of the interlayer connection conductor v11 is connected to the outer electrode 24. Thus, the interlayer connection conductor v11 makes an electrical connection between the first signal conductor layer 18 and the outer electrode 24. Incidentally, the interlayer connection conductor v12 has a structure that is in front-back symmetry to the interlayer connection conductor v11. Therefore, description of the interlayer connection conductor v12 is omitted.

The first interlayer connection conductors v1, the second interlayer connection conductors v2, and the interlayer connection conductors v11, v12 as described above are through holes. The through holes are formed by formation of open holes in the multilayer body 12 by a drill or a laser beam and subsequent formation of conductors on inner circumferential surfaces of the open holes by plating. As illustrated in FIGS. 4A and 4B, cavities are provided at centers of the through holes. Alternatively, the through holes may be filled.

As illustrated in FIGS. 3 and 4A and 4B, the conductor non-formed portions p1 and p2 where no conductor layer exists are provided on the first ground conductor layer 20. More particularly, at least a portion of the conductor non-formed portions p1 and p2 are provided in a first area A20 positioned at the right of the first interlayer connection conductors v1 with respect to the multilayer body left-right direction and at left of the second interlayer connection conductors v2 with respect to the multilayer body left-right direction in the view in the multilayer body downward direction. In the preferred embodiment, at least a portion of the conductor non-formed portions p1 is provided in a second area A21 positioned at the right of the first interlayer connection conductors v1 with respect to the multilayer body left-right direction and at left of the first signal conductor layer 18 with respect to the multilayer body left-right direction in the view in the multilayer body downward direction. In particular, the entirety of the conductor non-formed portions p1 is provided in the second area A21 positioned at the right of the first interlayer connection conductors v1 with respect to the multilayer body left-right direction and at the left of the first signal conductor layer 18 with respect to the multilayer body left-right direction in the view in the multilayer body downward direction. Accordingly, the conductor non-formed portions p1 do not overlap with the first signal conductor layer 18 in the view in the multilayer body downward direction. Similarly, the entirety of the conductor non-formed portions p2 is provided in a third area A22 positioned at the left of the second interlayer connection conductors v2 with respect to the multilayer body left-right direction and at the right of the first signal conductor layer 18 with respect to the multilayer body left-right direction in the view in the multilayer body downward direction. Accordingly, the conductor non-formed portions p2 do not overlap with the first signal conductor layer 18 in the view in the multilayer body downward direction.

As illustrated in FIG. 3, the conductor non-formed portions p1 preferably have rectangular or substantially rectangular shapes in the view in the multilayer body downward direction. The conductor non-formed portions p1 are arranged in a line at equal or substantially equal intervals along the multilayer body front-back direction. In the present preferred embodiment, each of the conductor non-formed portions p1 is not aligned with the first interlayer connection conductors v1 in the multilayer body left-right direction in the view in the multilayer body downward direction. Accordingly, the conductor non-formed portions p1 are each provided at the back of the first interlayer connection conductor v1 in front in two first interlayer connection conductors v1 adjoining in the multilayer body front-back direction. The conductor non-formed portions p1 are each provided in front of the first interlayer connection conductor v1 at back in the two first interlayer connection conductors v1 adjoining in the multilayer body front-back direction. Herein, placement of the conductor non-formed portion p1 in front of the first interlayer connection conductor v1 means a state to be described below. The conductor non-formed portion p1 is provided in front of a plane that passes through a front end of the first interlayer connection conductor v1 and that is orthogonal or substantially orthogonal to the front-back direction. In this case, the conductor non-formed portion p1 and the first interlayer connection conductor v1 may be in alignment in the front-back direction or may be out of alignment in the front-back direction. In the present preferred embodiment, the conductor non-formed portion p1 and the first interlayer connection conductor v1 are out of alignment in the front-back direction.

As illustrated in FIGS. 3, 4A, and 4B, a conductor non-formed portions p3 where no conductor layer exists are provided on the second ground conductor layer 22. The conductor non-formed portions p3 respectively overlap coincidentally with the conductor non-formed portions p1 in the view in the multilayer body downward direction. Therefore, description of the conductor non-formed portions p3 is omitted.

As illustrated in FIGS. 3 and 4A, the multilayer body 12 is provided with the voids h1 where no insulating resin exists. At least portions of the voids h1 respectively overlap with the conductor non-formed portions p1 and the conductor non-formed portions p3 in the first area A20 in the view in the multilayer body downward direction. In the present preferred embodiment, the voids h1 respectively overlap coincidentally with the conductor non-formed portions p1 and the conductor non-formed portions p3 in the view in the multilayer body downward direction. Accordingly, the voids h1 are provided in the second area A21 in the view in the multilayer body downward direction. In addition, the voids h1 do not overlap with the first signal conductor layer 18 in the view in the multilayer body downward direction.

As illustrated in FIG. 3, the voids h1 preferably have rectangular or substantially rectangular shapes in the view in the multilayer body downward direction. The voids h1 are arranged in a line at equal or substantially equal intervals along the multilayer body front-back direction. In the present preferred embodiment, each of the voids h1 is not aligned with the first interlayer connection conductors v1 in the multilayer body left-right direction in the view in the multilayer body downward direction. That is, the voids h1 do not overlap with the first interlayer connection conductors v1 in a view in a multilayer body leftward direction. Accordingly, each of the voids h1 is provided at back of the first interlayer connection conductor v1 in front in two first interlayer connection conductors v1 adjoining in the multilayer body front-back direction. Each of the voids h1 is provided in front of the first interlayer connection conductor v1 at back in the two first interlayer connection conductors v1 adjoining in the multilayer body front-back direction.

Further, as illustrated in FIGS. 4A and 4B, at least a portion of each of the voids h1 is provided above the first signal conductor layer 18 with respect to the multilayer body up-down direction and below the first ground conductor layer 20 with respect to the multilayer body up-down direction. In the present preferred embodiment, the voids h1 are open holes that penetrate from a top surface of the multilayer body 12 to a bottom surface of the multilayer body 12. Additionally, the voids h1 penetrate the resist layers 17a, 17b, as well, in the up-down direction. Accordingly, each of the voids h1 is also provided below the first signal conductor layer 18 with respect to the multilayer body up-down direction and above the second ground conductor layer 22 with respect to the multilayer body up-down direction. Thus, the conductor non-formed portion p1, the conductor non-formed portion p3, and the void h1 preferably define one space.

The conductor non-formed portions p2 and the voids h2 preferably have left-right symmetry to the conductor non-formed portions p1 and the voids h1. Therefore, description of the conductor non-formed portions p2 and the voids h2 is omitted.

In the signal transmission line 10 as described above, interlayer connection conductors that make electrical connections between the first ground conductor layer 20 and the second ground conductor layer 22 are not provided in the first area A20. In other words, interlayer connection conductors that are the closest to the signal transmission line 10 are the first interlayer connection conductors v1 and the second interlayer connection conductors v2.

In the signal transmission line 10, a change in characteristic impedance of the signal transmission line 10 can be reduced. More particularly, the conductor non-formed portions p1 are provided in the first area A20 positioned at the right of the first interlayer connection conductors v1 with respect to the multilayer body left-right direction and at the left of the second interlayer connection conductors v2 with respect to the multilayer body left-right direction in the view in the multilayer body downward direction. At least portions of the voids h1 respectively overlap with the conductor non-formed portions p1 in the view in the multilayer body downward direction. Thus, the conductor non-formed portions p1 are provided over the voids h1. Consequently, a change in a distance between the first signal conductor layer 18 and the first ground conductor layer 20 in the up-down direction is reduced even when the shapes of the voids h1 change. Thus, a change in a capacitance value between the first signal conductor layer 18 and the first ground conductor layer 20 is reduced and therefore the change in the characteristic impedance of the signal transmission line 10 is reduced.

In the signal transmission line 10, the signal transmission line 10 is made less susceptible to noises. More particularly, the conductor non-formed portions p1 are provided in the second area A21 positioned at the right of the first interlayer connection conductors v1 with respect to the multilayer body left-right direction and at the left of the first signal conductor layer 18 with respect to the multilayer body left-right direction in the view in the multilayer body downward direction. Thus, the conductor non-formed portions p1 do not overlap with the first signal conductor layer 18 in the view in the multilayer body downward direction. Therefore, noises that intrude into the signal transmission line 10 via the conductor non-formed portions p1 and that reach the first signal conductor layer 18 are reduced. As a result, the signal transmission line 10 is made less susceptible to the noises. For the same reason, noises that are radiated from the first signal conductor layer 18 and that leak out of the signal transmission line 10 via the conductor non-formed portions p1 are reduced.

In the signal transmission line 10, the change in the characteristic impedance of the signal transmission line 10 can be reduced for reasons below as well. More particularly, the voids h1 do not overlap with the first signal conductor layer 18 in the view in the multilayer body downward direction. Thus, vicinity in placement of the voids h1, which are prone to be transformed, to the first signal conductor layer 18 is reduced. As a result, the change in the characteristic impedance of the signal transmission line 10 that is caused by transformation of the voids h1 is reduced.

In the signal transmission line 10, maintenance of potential on the first ground conductor layer 20 and potential on the second ground conductor layer 22 at ground potential is facilitated. More particularly, the voids h1 do not overlap with the first interlayer connection conductors v1 in the view in the multilayer body leftward direction. Thus, the voids h1 are not provided at a right of the first interlayer connection conductor v1 with respect to the multilayer body left-right direction. Accordingly, the first interlayer connection conductors v1 can be thickened. Thickening of the first interlayer connection conductors v1 causes decrease in resistance values of the first interlayer connection conductors v1. As a result, the maintenance of the potential on the first ground conductor layer 20 and the potential on the second ground conductor layer 22 at the ground potential is facilitated.

Furthermore, the first interlayer connection conductors v1 are not provided at the left of the voids h1 with respect to the multilayer body left-right direction. Accordingly, the voids h1 can be enlarged. Enlargement of the voids h1 makes the multilayer body 12 more transformable. In addition, the enlargement of the voids h1 causes a reduction in dielectric loss in the signal transmission line 10.

Subsequently, the electronic device 1 including the signal transmission line 10 will be described with reference to FIG. 1. The electronic device 1 includes the signal transmission line 10 and a circuit board 100. The signal transmission line 10 further includes connectors 30a, 30b. The connector 30a is mounted on a bottom surface of a front end portion of the resist layer 17b. The connector 30a includes a center conductor and an outer conductor. The center conductor is electrically connected by solder to the outer electrode 24. The outer conductor is electrically connected by solder to the second ground conductor layer 22.

The connector 30b is mounted on a bottom surface of a back end portion of the resist layer 17b. The connector 30b includes a center conductor and an outer conductor. The center conductor is electrically connected by solder to the outer electrode 26. The outer conductor is electrically connected by solder to the second ground conductor layer 22.

The circuit board 100 includes a board body 102 and connectors 104a, 104b. The board body 102 has a plate shape. The connector 104a is mounted on a top surface of a front portion of the board body 102. The connector 104a includes a center conductor and an outer conductor. The center conductor of the connector 104a is connected to the center conductor of the connector 30a. The outer conductor of the connector 104a is connected to the outer conductor of the connector 30a.

The connector 104b is mounted on a top surface of a back portion of the board body 102. The connector 104b includes a center conductor and an outer conductor. The center conductor of the connector 104b is connected to the center conductor of the connector 30b. The outer conductor of the connector 104b is connected to the outer conductor of the connector 30b.

Meanwhile, as illustrated in FIG. 1, a position of the connector 104a with respect to the up-down direction differs from a position of the connector 104b with respect to the up-down direction. Accordingly, the signal transmission line 10 is curved when being used. The curved section A2 is curved by folding of the top surface of the multilayer body 12 in the up direction u and is curved by folding of the top surface of the multilayer body 12 in the down direction d.

Method for Manufacturing Signal Transmission Line

Hereinbelow, a non-limiting example of a method for manufacturing the signal transmission line 10 according to a preferred embodiment of the present invention will be described with reference to FIG. 3.

Initially, the first signal conductor layer 18, the first ground conductor layer 20, the second ground conductor layer 22, and the outer electrodes 24, 26 are formed on the top surfaces and the bottom surface of the insulating resin layers 16a to 16d. This step is an ordinary step and thus description thereof is omitted.

Subsequently, the insulating resin layers 16a to 16d are stacked in order of mention from the upside toward the downside in the multilayer body up-down direction, as illustrated in FIG. 3. Then, thermal pressure bonding is performed for the insulating resin layers 16a to 16d. Thus, the insulating resin layers 16a to 16d are integrated. Through this step, a multilayer body formation step in which the multilayer body 12 provided with the first signal conductor layer 18, the first ground conductor layer 20, the second ground conductor layer 22, and the outer electrodes 24, 26 is formed is completed.

Subsequently, the first interlayer connection conductors v1, the second interlayer connection conductors v2, and the interlayer connection conductors v11, v12 are formed in the multilayer body 12. Specifically, the open holes that penetrate the multilayer body 12 in the up-down direction are formed in the multilayer body 12 by laser beam irradiation. Metal film is formed on the inner circumferential surfaces of the open holes by plating of the open holes. Thus, an interlayer connection conductor formation step in which the first interlayer connection conductors v1, the second interlayer connection conductors v2, and the interlayer connection conductors v11, v12 are formed in the multilayer body 12 is completed.

Subsequently, as illustrated in FIG. 3, the resist layer 17a is formed on the top surface of the insulating resin layer 16a and the resist layer 17b is formed on the bottom surface of the insulating resin layer 16d. Formation of the resist layers 17a, 17b is preferably performed through printing, for example.

Subsequently, the conductor non-formed portions p1 to p4 and the voids h1, h2 are formed by formation of holes extending in the multilayer body downward direction from the top surface of the multilayer body 12 formed in the multilayer body formation step (void formation step). In the present preferred embodiment, the open holes that penetrate from the top surface of the multilayer body 12 to the bottom surface of the multilayer body 12 are formed. The open holes are formed by a laser beam, a drill, or the like, for instance. Through the above steps, the signal transmission line 10 is finished.

According to this example method for manufacturing the signal transmission line 10, the signal transmission line 10 can be easily manufactured. More particularly, the conductor non-formed portions p1 to p4 and the voids h1, h2 are formed by the formation of the holes extending in the multilayer body downward direction from the top surface of the multilayer body 12 formed in the multilayer body formation step. Thus, the conductor non-formed portions p1 to p4 and the voids h1, h2 can be collectively formed after the multilayer body 12 is formed. As a result, the signal transmission line 10 can be easily manufactured.

Furthermore, according to this example method for manufacturing the signal transmission line 10, the signal transmission line 10 can be easily manufactured. More particularly, in the void formation step, the open holes that penetrate from the top surface of the multilayer body 12 to the bottom surface of the multilayer body 12 are formed. When the open holes are formed, low accuracy in intensity of the laser beam or insertion depth of the drill is allowed. According to the method for manufacturing the signal transmission line 10, consequently, the signal transmission line 10 can be easily manufactured.

First Modification

Figure 5:
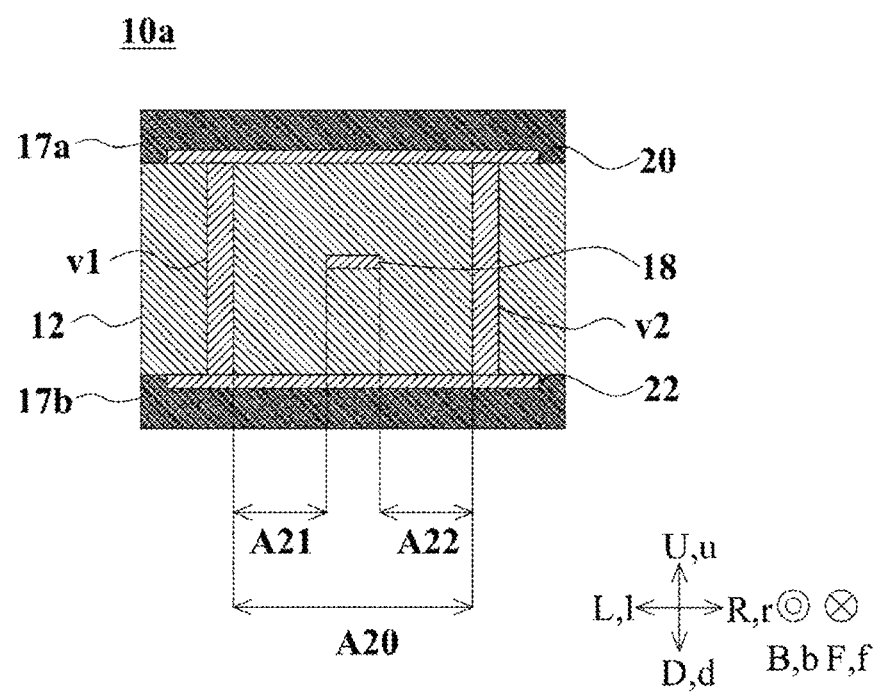
FIG. 5 is a sectional view of a signal transmission line, taken along line B-B.

Hereinbelow, a signal transmission line 10a according to a first modification of a preferred embodiment of the present invention will be described with reference to the drawings. FIG. 5 is a sectional view of the signal transmission line 10a, taken along line B-B. Incidentally, the perspective outline view of the signal transmission line 10 shown in FIG. 2 also corresponds to a perspective outline view of the signal transmission line 10a.

As illustrated in FIG. 5, the signal transmission line 10a preferably differs from the signal transmission line 10 of FIG. 3 in that the first interlayer connection conductors v1 and the second interlayer connection conductors v2 are via hole conductors. The via hole conductors are formed by filling of open holes formed in the insulating resin layers 16a to 16d (FIG. 3) with conductive paste including metal and resin and sintering of the conductive paste with heating. The resin remains in the via hole conductors. Incidentally, the other configurations of the signal transmission line 10a are identical to those configurations of the signal transmission line 10 and thus description thereof is omitted.

Second Modification

Figure 6A:
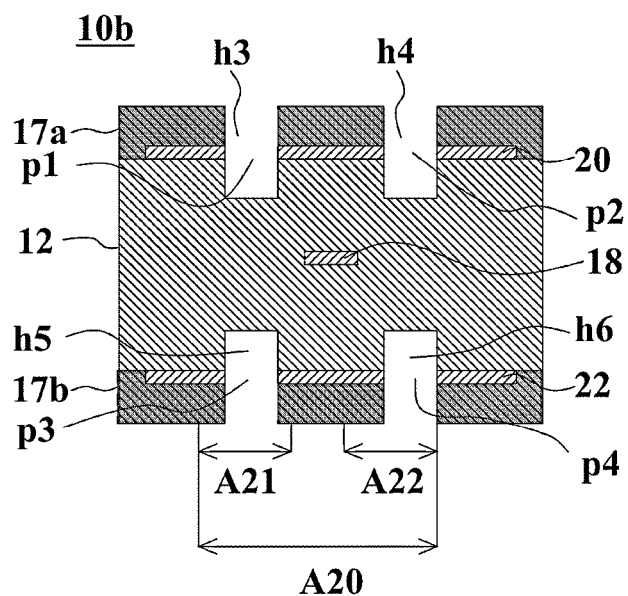
FIG. 6A is a sectional view of a signal transmission line, taken along line A-A.
Figure 6B:
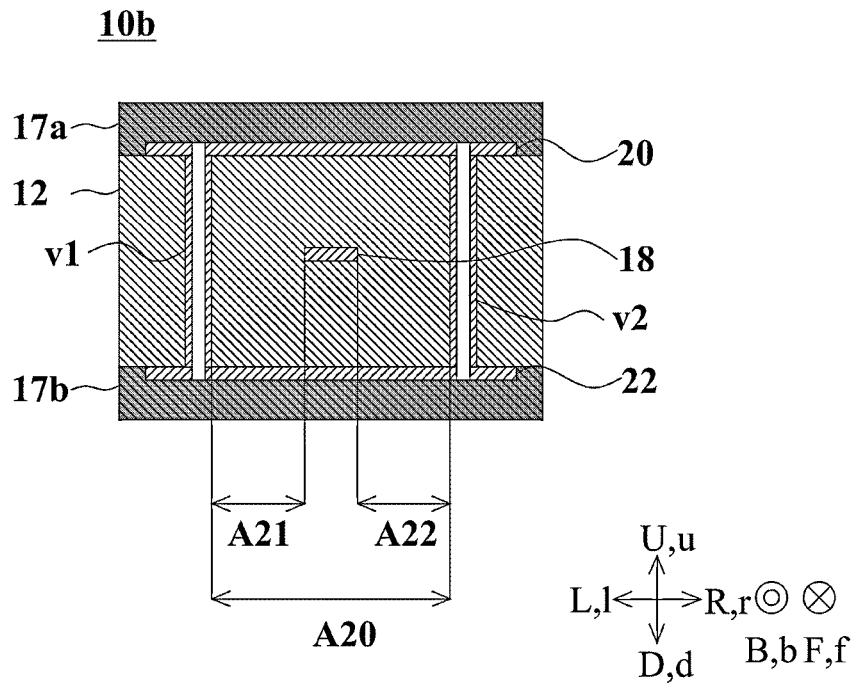
FIG. 6B is a sectional view of the signal transmission line, taken along line B-B.

Hereinbelow, a signal transmission line 10b according to a second modification of a preferred embodiment of the present invention will be described with reference to the drawings. FIG. 6A is a sectional view of the signal transmission line 10b, taken along line A-A. FIG. 6B is a sectional view of the signal transmission line 10b, taken along line B-B. The perspective outline view of the signal transmission line 10 shown in FIG. 2 also corresponds to a perspective outline view of the signal transmission line 10b.

The signal transmission line 10b differs from the signal transmission line 10 in that voids h3, h4, h5, and h6 are provided in place of the voids h1, h2 (FIGS. 3 and 4A). The voids h3, h5 preferably have a structure in which the void h1 is isolated to two portions. The voids h4, h6 have a structure in which the void h2 is isolated to two portions.

More particularly, in the signal transmission line 10b, the voids h1, h2 are the open holes that penetrate from the top surface of the multilayer body 12 to the bottom surface of the multilayer body 12. Meanwhile, the voids h3, h4 are holes that extend from the top surface of the multilayer body 12 in the multilayer body downward direction. The voids h3, h4 penetrate the resist layer 17a in the up-down direction. Lower ends of the voids h3, h4 are positioned above the first signal conductor layer 18 with respect to the multilayer body up-down direction and below the first ground conductor layer 20 with respect to the multilayer body up-down direction. The voids h5, h6 are holes that extend from the bottom surface of the multilayer body 12 in the multilayer body upward direction. The voids h5, h6 penetrate the resist layer 17b in the up-down direction. The voids h5 overlap with the voids h3 in the view in the multilayer body downward direction. The voids h6 overlap with the voids h4 in the view in the multilayer body downward direction. Upper ends of the voids h5, h6 are positioned below the first signal conductor layer 18 with respect to the multilayer body up-down direction and above the second ground conductor layer 22 with respect to the multilayer body up-down direction. The other configurations of the signal transmission line 10b are identical to those configurations of the signal transmission line 10 and thus description thereof is omitted.

In the signal transmission line 10b, strength of the multilayer body 12 increases because the voids h3 to h6 do not penetrate the multilayer body 12.

Third Modification

Figure 7A:
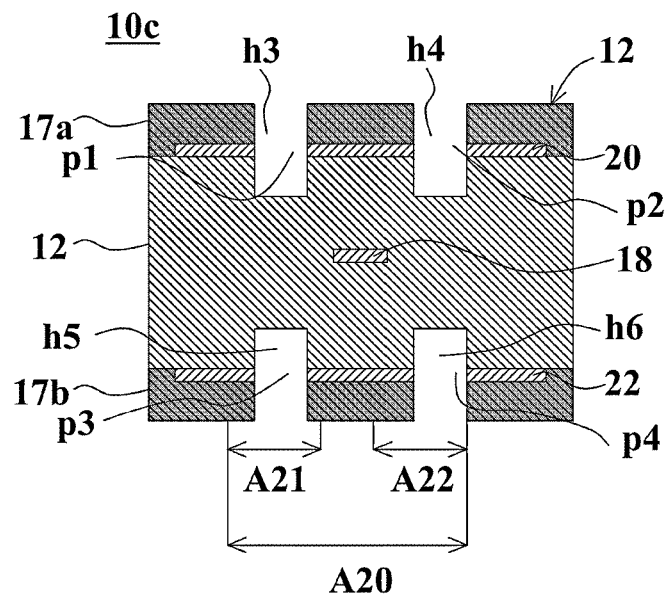
FIG. 7A is a sectional view of a signal transmission line, taken along line A-A.
Figure 7B:
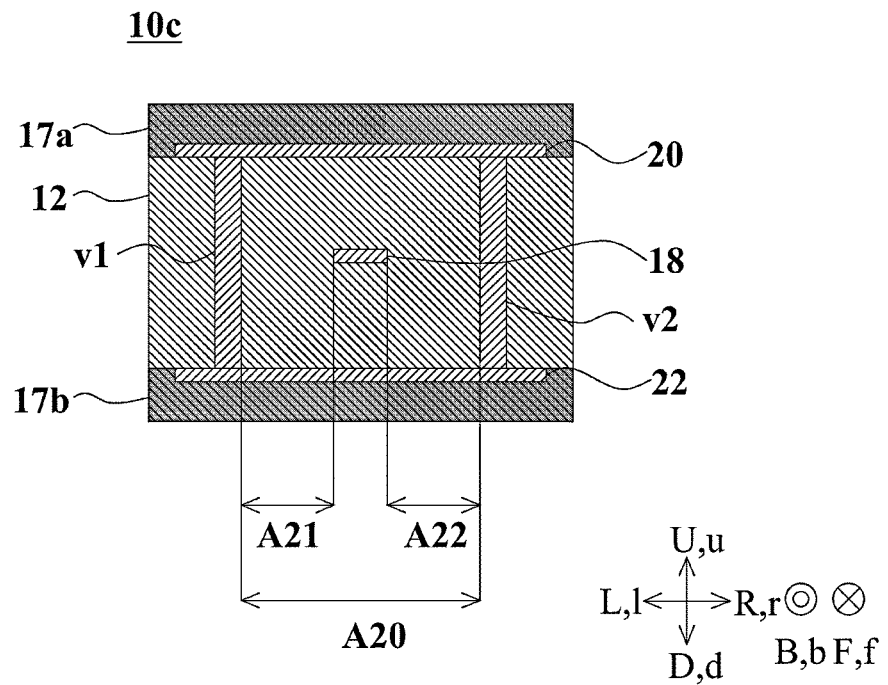
FIG. 7B is a sectional view of the signal transmission line, taken along line B-B.

Hereinbelow, a signal transmission line 10c according to a third modification of a preferred embodiment of the present invention will be described with reference to the drawings. FIG. 7A is a sectional view of the signal transmission line 10c, taken along line A-A. FIG. 7B is a sectional view of the signal transmission line 10c, taken along line B-B. Incidentally, the perspective outline view of the signal transmission line 10 shown in FIG. 2 as also corresponds to a perspective outline view of the signal transmission line 10c.

As illustrated in FIGS. 7A and 7B, the signal transmission line 10c differs from the signal transmission line 10b in that the first interlayer connection conductors v1 and the second interlayer connection conductors v2 are via hole conductors. Incidentally, the other configurations of the signal transmission line 10c are identical to those configurations of the signal transmission line 10b and thus description thereof is omitted.

Fourth Modification

Figure 8:
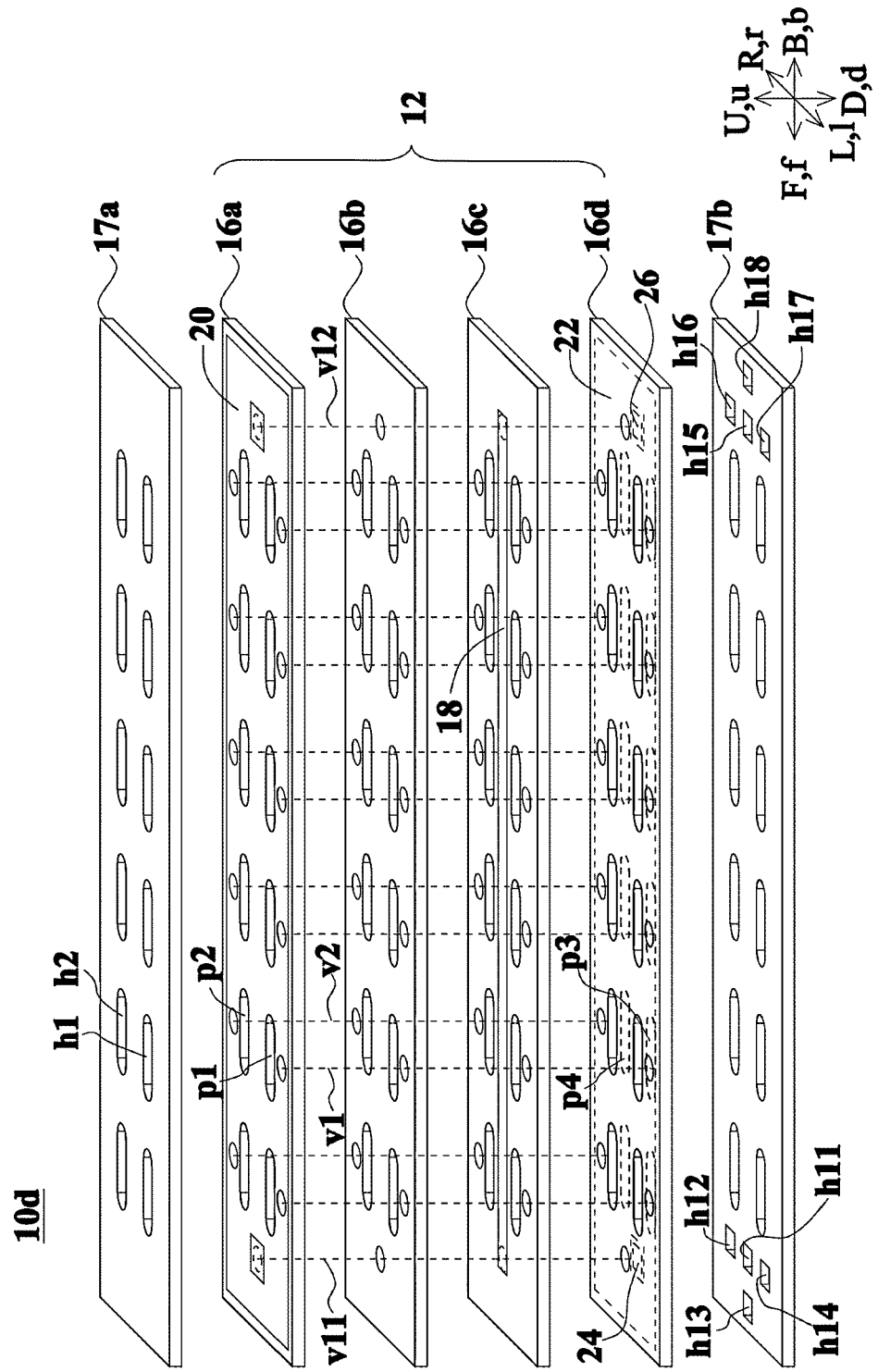
FIG. 8 is an exploded perspective view of a signal transmission line according to a preferred embodiment of the present invention.

Hereinbelow, a signal transmission line 10d according to a fourth modification of a preferred embodiment of the present invention will be described with reference to the drawing. FIG. 8 is an exploded perspective view of the signal transmission line 10d.

The signal transmission line 10d differs from the signal transmission line 10 of FIG. 3 in shapes of the voids h1, h2, shapes of the conductor non-formed portions p1, p2, p3, and p4, positions of the first interlayer connection conductors v1, and positions of the second interlayer connection conductors v2. Hereinbelow, the signal transmission line 10d will be described with a focus on such differences.

Front end portions of the voids h1 have a semicircular or substantially semicircular shape that protrudes in the multilayer body frontward direction in the view in the multilayer body downward direction. Thus, widths of the front end portions of the voids h1 with respect to the multilayer body left-right direction decrease in the multilayer body frontward direction. Meanwhile, back end portions of the voids h1 have a semicircular or substantially semicircular shape that protrudes in the multilayer body backward direction in the view in the multilayer body downward direction. Thus, widths of the back end portions of the voids h1 with respect to the multilayer body left-right direction decrease in the multilayer body backward direction. Further, widths with respect to the multilayer body left-right direction of portions between the front end portions of the voids h1 and the back end portions of the voids h1 are constant. The voids h1 have an above structure and thus distances between the voids h1 and the first signal conductor layer 18 gradually change in the front end portions of the voids h1 and the back end portions of the voids h1. Thus, a sharp change in relative permittivity around the first signal conductor layer 18 is reduced and a sharp change in characteristic impedance of the signal transmission line 10d is reduced. The voids h2 have a structure that is in left-right symmetry to the voids h1. Therefore, description of the voids h2 is omitted.

Further, shapes of the conductor non-formed portions p1 are the same or substantially the same as the shapes of the voids h1 in the view in the multilayer body downward direction. Thus, distances between the conductor non-formed portions p1 and the first signal conductor layer 18 gradually change in front end portions of the conductor non-formed portions p1 and back end portions of the conductor non-formed portions p1. Thus, a sharp change in the capacitance value between the first signal conductor layer 18 and the first ground conductor layer 20 is reduced. Accordingly, the sharp change in the characteristic impedance of the signal transmission line 10d is reduced. Incidentally, the conductor non-formed portions p2 have a structure that is in left-right symmetry to the conductor non-formed portions p1. Therefore, description of the conductor non-formed portions p2 is omitted.

The first interlayer connection conductors v1 respectively overlap with the voids h1 in the view in the multilayer body leftward direction. That is, the voids h1 respectively overlap with the first interlayer connection conductors v1 in the view in the multilayer body leftward direction. Meanwhile, a length of the voids h1 in the multilayer body front-back direction is longer than a length of the first interlayer connection conductors v1 in the multilayer body front-back direction. Thus, the voids h1 are respectively provided between the first interlayer connection conductors v1 and the first signal conductor layer 18 in the view in the multilayer body downward direction. In the signal transmission line 10d, capacitance coupling between the first signal conductor layer 18 and the first interlayer connection conductors v1 can be reduced. Incidentally, the second interlayer connection conductors v2 have a structure that is in left-right symmetry to the first interlayer connection conductors v1. Therefore, description of the second interlayer connection conductors v2 is omitted.

Fifth Modification

Figure 9:
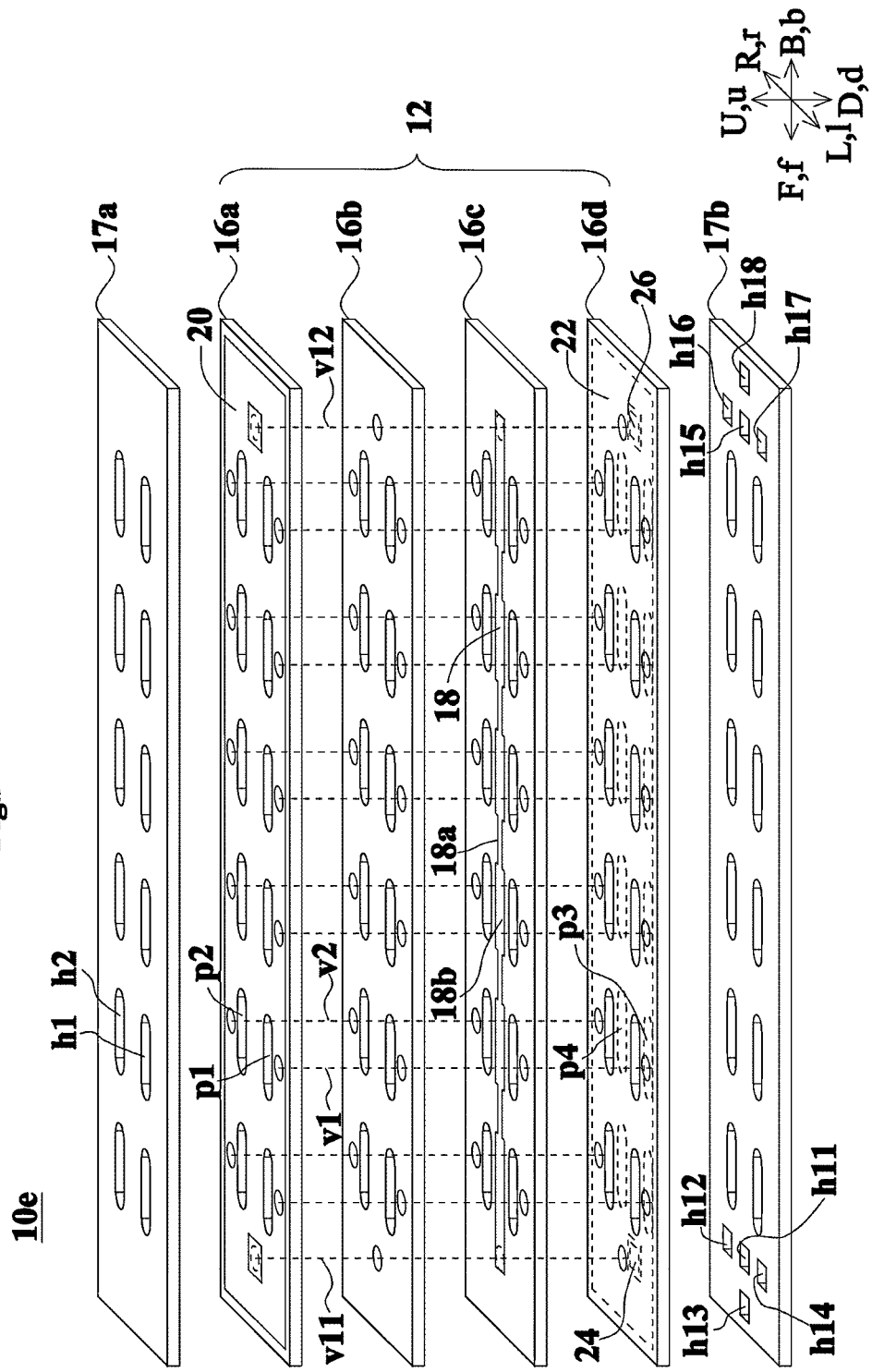
FIG. 9 is an exploded perspective view of a signal transmission line according to a preferred embodiment of the present invention.

Hereinbelow, a signal transmission line 10e according to a fifth modification of a preferred embodiment of the present invention will be described with reference to the drawing. FIG. 9 is an exploded perspective view of the signal transmission line 10e.

The signal transmission line 10e differs from the signal transmission line 10d of FIG. 8 in a shape of the first signal conductor layer 18. Hereinbelow, the signal transmission line 10e will be described with a focus on such a difference.

The first signal conductor layer 18 includes first signal conductor layer thin portions 18a and first signal conductor layer thick portions 18b. The first signal conductor layer thin portions 18a have relatively thin widths with respect to the multilayer body left-right direction. The first signal conductor layer thick portions 18b have relatively thick widths with respect to the multilayer body left-right direction. That is, the widths of the first signal conductor layer thin portions 18a with respect to the multilayer body left-right direction are thinner than the widths of the first signal conductor layer thick portions 18b with respect to the multilayer body left-right direction. In addition, the first signal conductor layer thick portions 18b overlap with the voids h1, h2 in the view in the multilayer body leftward direction. The first signal conductor layer thin portions 18a do not overlap with the voids h1, h2 in the view in the multilayer body leftward direction.

In the signal transmission line 10e, a resistance value of the first signal conductor layer 18 can be reduced. More particularly, the voids h1, h2 are provided around the first signal conductor layer 18. Thus, the relative permittivity around the first signal conductor layer 18 is reduced. Accordingly, the capacitance value generated in the first signal conductor layer 18 resists being increased. Meanwhile, the first signal conductor layer thick portions 18b overlap with the voids h1, h2 in the view in the multilayer body leftward direction. Accordingly, the width of the first signal conductor layer 18 with respect to the multilayer body left-right direction is partially increased. As a result, the resistance value of the first signal conductor layer 18 can be reduced.

Sixth Modification

Figure 10:
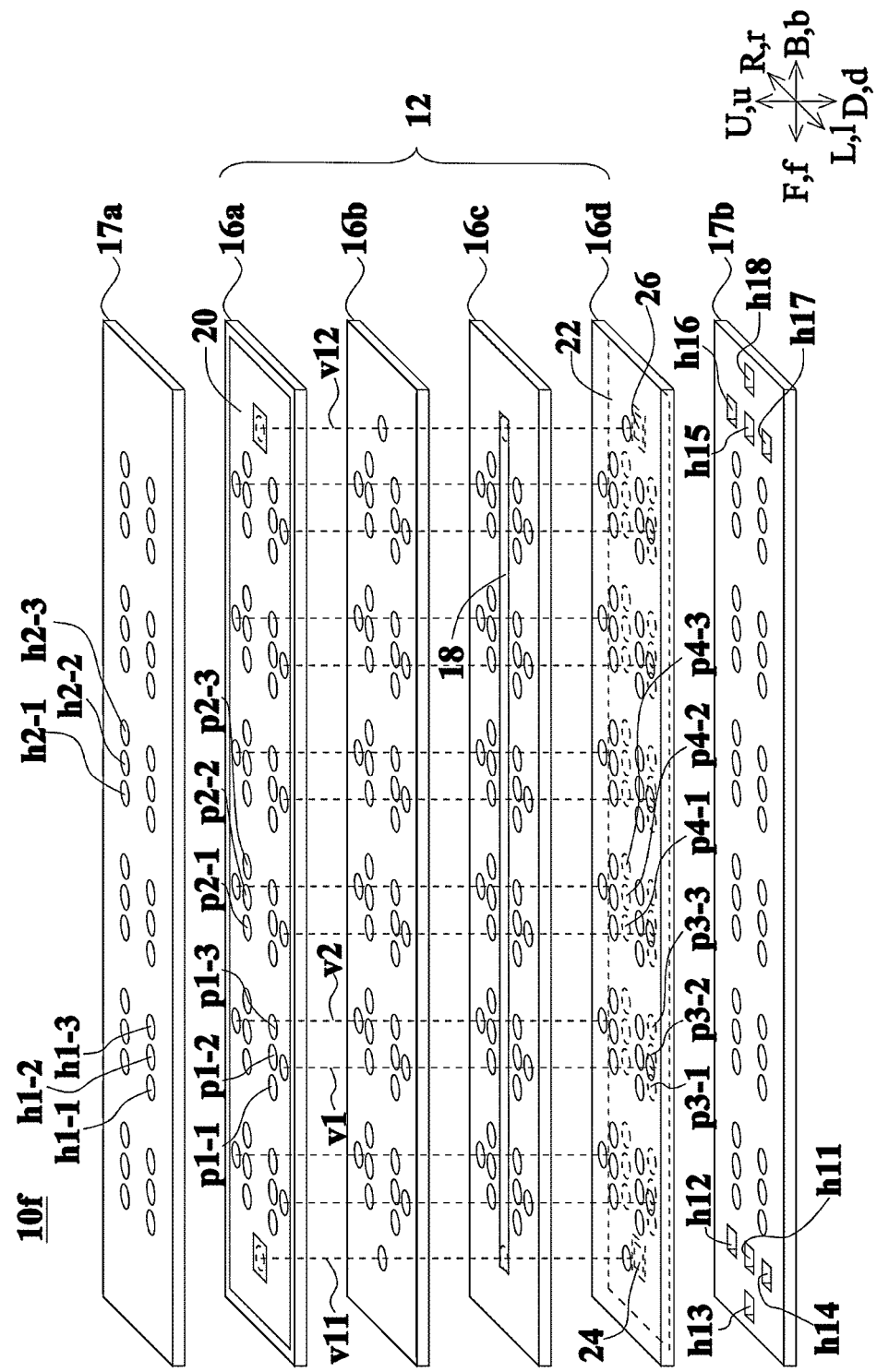
FIG. 10 is an exploded perspective view of a signal transmission line according to a preferred embodiment of the present invention.

Hereinbelow, a signal transmission line 10f according to a sixth modification of a preferred embodiment of the present invention will be described with reference to the drawing. FIG. 10 is an exploded perspective view of the signal transmission line 10f.

The signal transmission line 10f differs from the signal transmission line 10e of FIG. 9 in that-a voids h1-1, h1-2, and h1-3, and h2-1, h2-2, and h2-3 are provided in place of the voids h1, h2 of FIG. 9 and conductor non-formed portions p1-1, p1-2, p1-3, p2-1, p2-2, p2-3, p3-1, p3-2, p3-3, p4-1, p4-2, p4-3 are provided in place of the conductor non-formed portions p1, p2, p3, p4 of FIG. 9. More particularly, in the signal transmission line 10f, the voids h1-1 to h1-3 are provided in place of the one void h1. The voids h1-1 to h1-3 are arranged from a front side toward a back side in order of mention at equal or substantially equal intervals along the multilayer body front-back direction in a site the same or substantially the same as a site where the void h1 is provided. The voids h1-1 to h1-3 have circular or substantially circular shapes in the view in the multilayer body downward direction. In the signal transmission line 10f, consequently, the voids h1-1 to h1-3 can be easily formed by a drill or a laser beam. The voids h2-1 to h2-3 have a structure that is in left-right symmetry to the voids h1-1 to h1-3. Therefore, description of the voids h2-1 to h2-3 is omitted.

Seventh Modification

Figure 11:
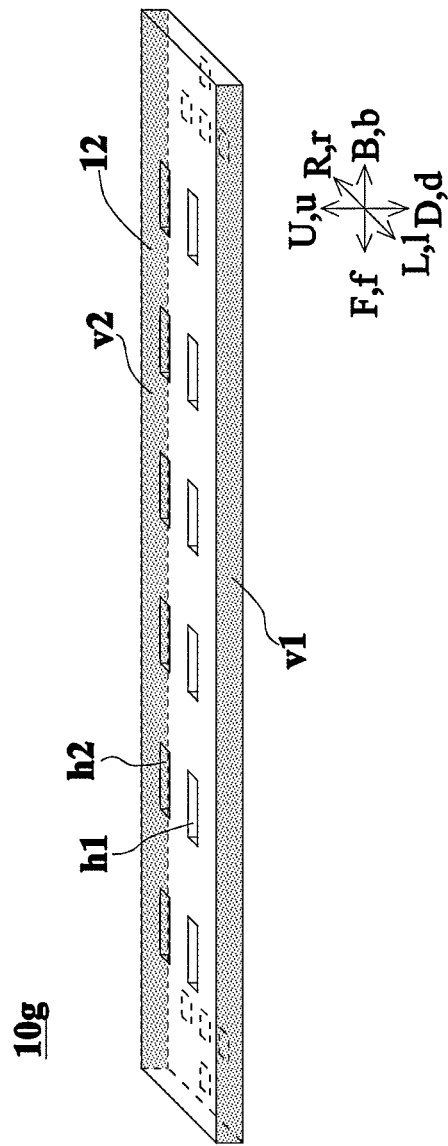
FIG. 11 is a perspective view of a signal transmission line according to a preferred embodiment of the present invention.
Figure 12:
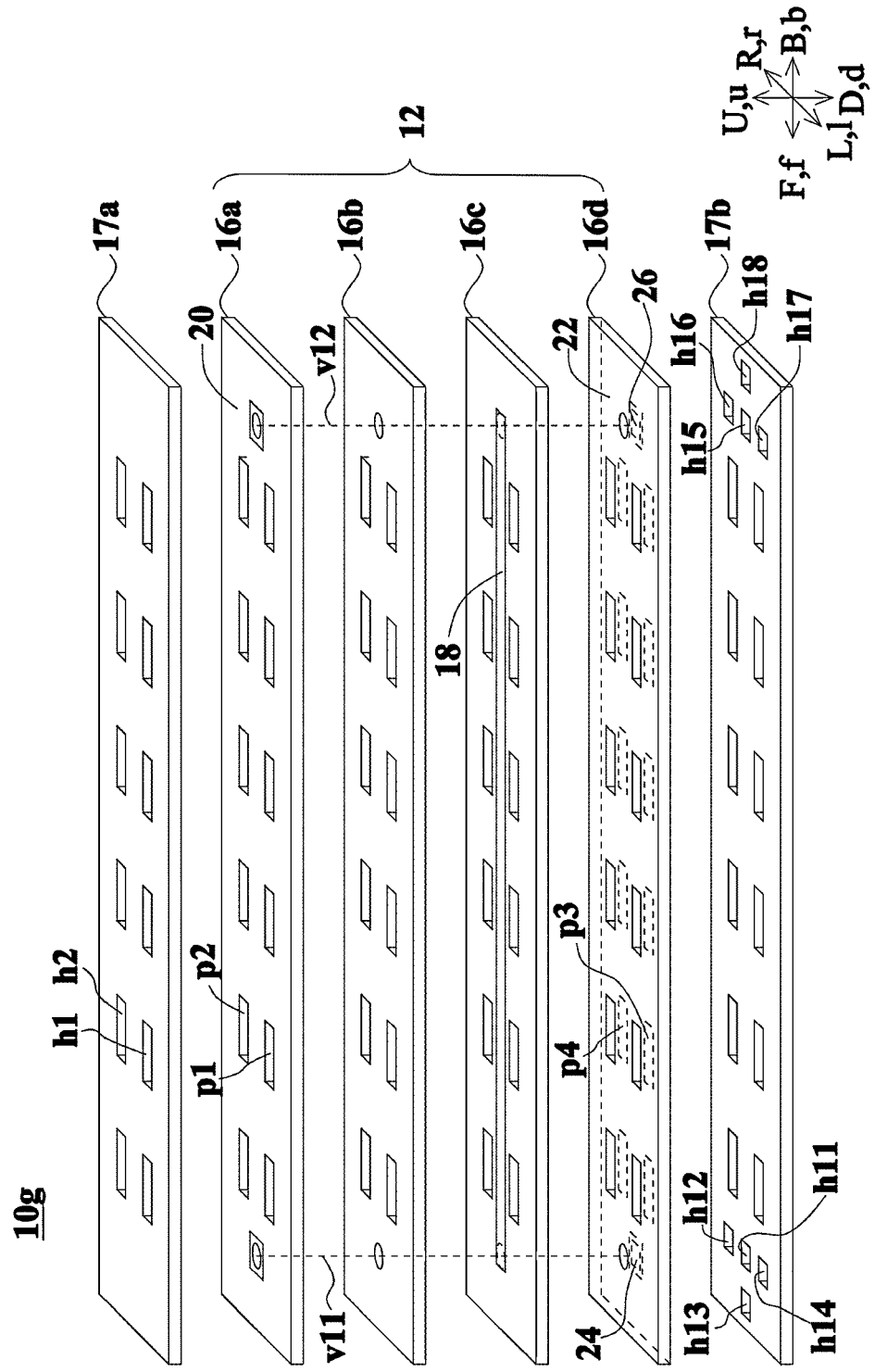
FIG. 12 is an exploded perspective view of the signal transmission line.

Hereinbelow, a signal transmission line 10g according to a seventh modification of a preferred embodiment of the present invention will be described with reference to the drawings. FIG. 11 is a perspective view of the signal transmission line 10g. FIG. 12 is an exploded perspective view of the signal transmission line 10g.

The signal transmission line 10g differs from the signal transmission line 10 of FIG. 3 in the structures of the first interlayer connection conductors v1 and the second interlayer connection conductors v2 as shown in FIG. 11. Hereinbelow, the signal transmission line 10g will be described with a focus on such a difference.

In the signal transmission line 10g, the first interlayer connection conductor v1 is provided on a left surface of the multilayer body 12. The second interlayer connection conductor v2 is provided on a right surface of the multilayer body 12. The first interlayer connection conductor v1 and the second interlayer connection conductor v2 are formed by plating, for example, to respectively cover the whole left surface of the multilayer body 12 and the entire or substantially the entire right surface of the multilayer body 12.

Meanwhile, as shown in FIG. 12, the first ground conductor layer 20 borders on a left side and a right side of the insulating resin layer 16a. Thus, the first ground conductor layer 20 is exposed to outside of the multilayer body 12 from between the insulating resin layer 16a and the resist layer 17a. Thus, the first ground conductor layer 20 is connected to the first interlayer connection conductor v1 and the second interlayer connection conductor v2.

Meanwhile, the second ground conductor layer 22 borders on a left side and a right side of the insulating resin layer 16d. Thus, the second ground conductor layer 22 is exposed to the outside of the multilayer body 12 from between the insulating resin layer 16d and the resist layer 17b. Thus, the second ground conductor layer 22 is connected to the first interlayer connection conductor v1 and the second interlayer connection conductor v2.

In the signal transmission line 10g, the left surface of the multilayer body 12 and the right surface of the multilayer body 12 are respectively covered with the first interlayer connection conductor v1 and the second interlayer connection conductor v2 that are connected to the ground potential. In the signal transmission line 10g, consequently, the signal transmission line 10g is made less susceptible to noises. In the signal transmission line 10g, the noises that are radiated from the first signal conductor layer 18 and that leak out of the signal transmission line 10g are reduced.

Eighth Modification

Hereinbelow, a signal transmission line 10h according to an eighth modification of a preferred embodiment of the present invention will be described with reference to the drawing. FIG. 13 is a sectional view of the signal transmission line 10h.

The signal transmission line 10h differs from the signal transmission line 10d of FIG. 8 in that the signal transmission line 10h further includes a second signal conductor layer 118 and interlayer connection conductors v3 and in that voids h101, h102 are provided. Hereinbelow, the signal transmission line 10h will be described with a focus on such differences.

The second signal conductor layer 118 is provided in the multilayer body 12 to be positioned at a left of the first signal conductor layer 18 and the first interlayer connection conductors v1 with respect to the multilayer body left-right direction. The second signal conductor layer 118 is provided at the left of the first signal conductor layer 18. The second signal conductor layer 118 extends in the multilayer body front-back direction.

The first ground conductor layer 20 is provided above the second signal conductor layer 118 with respect to the multilayer body up-down direction to overlap with the second signal conductor layer 118 in the view in the multilayer body downward direction. The second ground conductor layer 22 is provided below the second signal conductor layer 118 with respect to the multilayer body up-down direction to overlap with the second signal conductor layer 118 in the view in the multilayer body downward direction.

The interlayer connection conductors v3 are provided at a left of the second signal conductor layer 118. The interlayer connection conductors v3 make electrical connections between the first ground conductor layer 20 and the second ground conductor layer 22.

The voids h101 extend in the multilayer body up-down direction between the second signal conductor layer 118 and the interlayer connection conductors v3. The voids h101 penetrate the multilayer body 12 and the resist layers 17a, 17b in the up-down direction. The voids h102 extend in the multilayer body up-down direction between the second signal conductor layer 118 and the first interlayer connection conductors v1. The voids h102 penetrate the multilayer body 12 and the resist layers 17a, 17b in the up-down direction.

In the signal transmission line 10h, the voids h1, h102 and the first interlayer connection conductors v1 are provided between the first signal conductor layer 18 and the second signal conductor layer 118. Thus, isolation between the first signal conductor layer 18 and the second signal conductor layer 118 is ensured.

Ninth Modification

Figure 14:
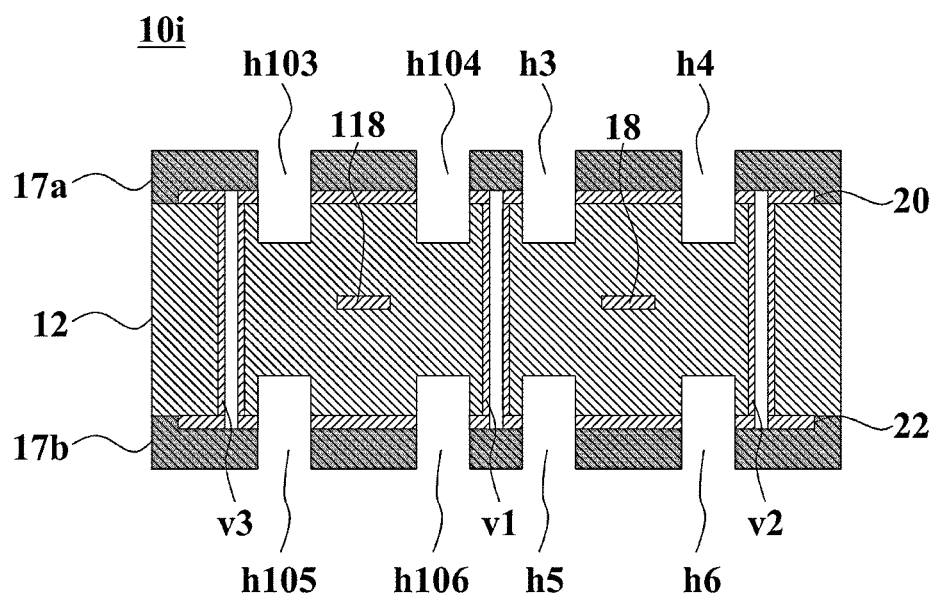
FIG. 14 is a sectional view of a signal transmission line according to a preferred embodiment of the present invention.

Hereinbelow, a signal transmission line 10i according to a ninth modification of a preferred embodiment of the present invention will be described with reference to the drawing. FIG. 14 is a sectional view of the signal transmission line 10i.

The signal transmission line 10i differs from the signal transmission line 10h in that voids h3, h4, h5, and h6, h103, h104, h105, and h106 are provided in place of the voids h1, h2, h101, h102 of FIG. 13. The voids h3, h5 have a structure in which the void h1 is isolated to two portions. The voids h4, h6 have a structure in which the void h2 is isolated to two portions. The voids h103, h105 have a structure in which the void h101 is isolated to two portions. The voids h104, h106 have a structure in which the void h102 is isolated to two portions.

More particularly, as shown in FIG. 13, in the signal transmission line 10h, the voids h1, h2 are open holes that penetrate from the top surface of the multilayer body 12 to the bottom surface of the multilayer body 12. Meanwhile, as shown in FIG. 14, the voids h3, h4 are holes that extend from the top surface of the multilayer body 12 in the multilayer body downward direction. The voids h3, h4 penetrate the resist layer 17a in the up-down direction. Lower ends of the voids h3, h4 are positioned above the first signal conductor layer 18 with respect to the multilayer body up-down direction and below the first ground conductor layer 20 with respect to the multilayer body up-down direction. The voids h5, h6 are holes that extend from the bottom surface of the multilayer body 12 in the multilayer body upward direction. The voids h5, h6 penetrate the resist layer 17b in the up-down direction. The voids h5 overlap with the voids h3 in the view in the multilayer body downward direction. The voids h6 overlap with the voids h4 in the view in the multilayer body downward direction. Upper ends of the voids h5, h6 are positioned below the first signal conductor layer 18 with respect to the multilayer body up-down direction and above the second ground conductor layer 22 with respect to the multilayer body up-down direction.

In the signal transmission line 10h of FIG. 13, the voids h101, h102 are open holes that penetrate from the top surface of the multilayer body 12 to the bottom surface of the multilayer body 12. Meanwhile, the voids h103, h104 are holes that extend from the top surface of the multilayer body 12 in the multilayer body downward direction. The voids h103, h104 penetrate the resist layer 17a in the up-down direction. Lower ends of the voids h103, h104 are positioned above the second signal conductor layer 118 with respect to the multilayer body up-down direction and below the first ground conductor layer 20 with respect to the multilayer body up-down direction. The voids h105, h106 are holes that extend from the bottom surface of the multilayer body 12 in the multilayer body upward direction. The voids h105, h106 penetrate the resist layer 17b in the up-down direction. The voids h105 overlap with the voids h103 in the view in the multilayer body downward direction. The voids h106 overlap with the voids h104 in the view in the multilayer body downward direction. Upper ends of the voids h105, h106 are positioned below the second signal conductor layer 118 with respect to the multilayer body up-down direction and above the second ground conductor layer 22 with respect to the multilayer body up-down direction. The other configurations of the signal transmission line 10i are identical to those of the signal transmission line 10h and thus description thereof is omitted.

Other Preferred Embodiments

Signal transmission lines according to the present invention are not limited to the signal transmission lines 10, 10a to 10i and may be modified within the scope of the present invention. Meanwhile, configurations of the signal transmission lines 10, 10a to 10i may be combined.

In the signal transmission lines 10, 10a to 10i, the first signal conductor layer 18 and the second signal conductor layer 118 linearly extend in the front-back direction. The first signal conductor layer 18 and the second signal conductor layer 118, however, may be curved in a view in the downward direction. In curved portions of the first signal conductor layer 18 and the second signal conductor layer 118, in this case, the multilayer body front-back direction is a direction in which tangents to the first signal conductor layer 18 and the second signal conductor layer 118 extend.

In the signal transmission lines 10, 10a to 10i, the voids h1 may overlap with the first signal conductor layer 18 in the view in the multilayer body downward direction. In this case, the conductor non-formed portions p1 may overlap with the first signal conductor layer 18 or may escape from overlapping with the first signal conductor layer 18 in the view in the multilayer body downward direction. In terms of reduction in the change in the characteristic impedance of the signal transmission lines 10, 10a to 10i, however, it is preferable that the voids h1 and the conductor non-formed portions p1 should not overlap with the first signal conductor layer 18 in the view in the multilayer body downward direction. In this case, noises that intrude into the signal transmission line 10 via the conductor non-formed portions p1 and that reach the first signal conductor layer 18 are reduced. As a result, the signal transmission line 10 is made less susceptible to the noises. For the same reason, noises that are radiated from the first signal conductor layer 18 and that leak out of the signal transmission line 10 via the conductor non-formed portions p1 are reduced.

In the signal transmission lines 10, 10a to 10i, it is sufficient if at least a portion of the conductor non-formed portions p1 is provided at the right of the first interlayer connection conductors v1 with respect to the multilayer body left-right direction in the view in the multilayer body downward direction. Accordingly, a portion of the conductor non-formed portions p1 may be provided at a left of right ends of the first interlayer connection conductors v1 in the view in the multilayer body downward direction. Further, a portion of the voids h1 may be provided at the left of the right ends of the first interlayer connection conductors v1 in the view in the multilayer body downward direction. In this case, the voids h1 may overlap with the conductor non-formed portions p1 at the left of the right ends of the first interlayer connection conductors v1 in the view in the multilayer body downward direction.

In the signal transmission lines 10, 10a to 10i, an insulating resin layer may exist between the conductor non-formed portions p1 and the voids h1, h1-1 to h1-3, h3. That is, the conductor non-formed portions p1 may be isolated from the voids h1, h1-1 to h1-3, h3.

In the signal transmission line 10e, the first signal conductor layer thick portions 18b may escape from overlapping with the voids h1 in the view in the multilayer body leftward direction.

In the signal transmission lines 10, 10a to 10i, the voids h1 to h6, h101 to h106 are preferably provided in the curved section A2 (FIG. 1). Thus, the curved section A2 is made more transformable. In the signal transmission lines 10, 10a to 10i, however, the voids h1 to h6, h101 to h106 may not be provided in the curved section A2.

In the signal transmission lines 10, 10a to 10i, it is preferable that the first interlayer connection conductors v1 and the second interlayer connection conductors v2 should not be provided in the curved section A2. Thus, the curved section A2 is made more transformable. In the signal transmission lines 10, 10a to 10i, however, the first interlayer connection conductors v1 and the second interlayer connection conductors v2 may be provided in the curved section A2.

In non-limiting examples of methods for manufacturing the signal transmission line 10, 10a to 10i, the voids h1 to h6, h101 to h106 may be formed in the multilayer body 12 before the formation of the resist layers 17a, 17b. In this case, the voids h1 to h6, h101 to h106 are not filled with material of the resist layers 17a, 17b. The material of the resist layers 17a, 17b, however, may have slightly flowed into the voids h1 to h6, h101 to h106.

In the signal transmission lines 10, 10a to 10i, the voids h1 coincidentally overlap with the conductor non-formed portions p1 in the view in the multilayer body downward direction. The voids h1 may overlap with the conductor non-formed portions p1 to not coincide therewith in the view in the multilayer body downward direction. It is preferable, however, that the voids h1 should not extend beyond the conductor non-formed portions p1 in the view in the multilayer body downward direction. That is, the voids h1 preferably fit into areas surrounded by outer borders of the conductor non-formed portions p1 in the view in the multilayer body downward direction. Thus, existence of the voids h1 between the first signal conductor layer 18 and the first ground conductor layer 20 is reduced. As a result, the change in the characteristic impedance of the signal transmission line 10, 10a to 10i can be reduced.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A signal transmission line comprising:
   a multilayer body including a structure in which a plurality of insulating resin layers are laminated in a multilayer body up-down direction;
   a first signal conductor layer in the multilayer body, the first signal conductor layer extending in a multilayer body front-back direction;
   a first ground conductor layer on the multilayer body, the first ground conductor layer being positioned above the first signal conductor layer with respect to the multilayer body up-down direction to overlap with the first signal conductor layer in a view in a multilayer body downward direction;
   a second ground conductor layer on the multilayer body, the second ground conductor layer being positioned below the first signal conductor layer with respect to the multilayer body up-down direction to overlap with the first signal conductor layer in the view in the multilayer body downward direction;
   a first interlayer connection conductor in the multilayer body and positioned at a left of the first signal conductor layer with respect to a multilayer body left-right direction, the first interlayer connection conductor making an electrical connection between the first ground conductor layer and the second ground conductor layer; and
   a second interlayer connection conductor in the multilayer body and positioned at a right of the first signal conductor layer with respect to the multilayer body left-right direction, the second interlayer connection conductor making an electrical connection between the first ground conductor layer and the second ground conductor layer; wherein a conductor non-formed portion where no conductor layer exists is provided in the first ground conductor layer;
   the multilayer body includes a void where no insulating resin exists;
   a dimension of the void in the multilayer body left-right direction is less than a dimension of the multilayer body in the multilayer body left-right direction;
   at least a portion of the conductor non-formed portion is provided in a first area positioned at a right of the first interlayer connection conductor with respect to the multilayer body left-right direction and at a left of the second interlayer connection conductor with respect to the multilayer body left-right direction in the view in the multilayer body downward direction;
   at least a portion of the void overlaps with the conductor non-formed portion in the first area in the view in the multilayer body downward direction and is provided above the first signal conductor layer with respect to the multilayer body up-down direction and below the first ground conductor layer with respect to the multilayer body up-down direction; and
   a third interlayer connection conductor that makes an electrical connection between the first ground conductor layer and the second ground conductor layer is not provided in the first area.

2. The signal transmission line according to claim 1, wherein at least a portion of the conductor non-formed portion is provided in a second area positioned at a right of the first interlayer connection conductor with respect to the multilayer body left-right direction and at left of the first signal conductor layer with respect to the multilayer body left-right direction in the view in the multilayer body downward direction.

3. The signal transmission line according to claim 1, wherein the conductor non-formed portion and the void define one space.

4. The signal transmission line according to claim 1, wherein the void is a hole that extends from a top surface of the multilayer body in the multilayer body downward direction.

5. The signal transmission line according to claim 1, wherein the void is an open hole that penetrates from a top surface of the multilayer body to a bottom surface of the multilayer body.

6. The signal transmission line according to claim 1, wherein the void does not overlap with the first signal conductor layer in the view in the multilayer body downward direction.

7. The signal transmission line according to claim 1, wherein the void does not overlap with the first interlayer connection conductor in a view in a multilayer body leftward direction.

8. The signal transmission line according to claim 1, wherein the void overlaps with the first interlayer connection conductor in a view in a multilayer body leftward direction.

9. The signal transmission line according to claim 8, wherein a length of the void in the multilayer body front-back direction is longer than a length of the first interlayer connection conductor in the multilayer body front-back direction.

10. The signal transmission line according to claim 1, wherein
    a width of a first end portion of the void with respect to the multilayer body left-right direction decreases in a multilayer body frontward direction; and
    a width of a second end portion of the void with respect to the multilayer body left-right direction decreases in a multilayer body backward direction.

11. The signal transmission line according to claim 1, wherein
    the first signal conductor layer includes a first signal conductor layer thin portion having a relatively thin width with respect to the multilayer body left-right direction and a first signal conductor layer thick portion having a relatively thick width with respect to the multilayer body left-right direction; and the first signal conductor layer thick portion overlaps with the void in the view in the multilayer body leftward direction.

12. The signal transmission line according to claim 1, wherein the first interlayer connection conductor is provided on a left surface of the multilayer body.

13. The signal transmission line according to claim 1, wherein the signal transmission line includes a curved section curved in an up-down direction.

14. The signal transmission line according to claim 13, wherein the void is provided in the curved section.

15. The signal transmission line according to claim 13, wherein the first interlayer connection conductor and the second interlayer connection conductor are not provided in the curved section.

16. The signal transmission line according to claim 1, further comprising:
 a second signal conductor layer in the multilayer body and positioned at a left of the first signal conductor layer and the first interlayer connection conductor with respect to the multilayer body left-right direction, the second signal conductor layer extending in the multilayer body front-back direction; wherein
 the first ground conductor layer is above the second signal conductor layer with respect to the multilayer body up-down direction to overlap with the second signal conductor layer in the view in the multilayer body downward direction; and
 the second ground conductor layer is below the second signal conductor layer with respect to the multilayer body up-down direction to overlap with the second signal conductor layer in the view in the multilayer body downward direction.

17. The signal transmission line according to claim 1, wherein the void does not extend beyond the conductor non-formed portion in the view in the multilayer body downward direction.

18. The signal transmission line according to claim 1, further comprising two connectors mounted to a bottom surface of the signal transmission line.

19. A method for manufacturing the signal transmission line according to claim 1, the method comprising:
 a multilayer body formation step of forming the multilayer body provided with the first signal conductor layer, the first ground conductor layer, and the second ground conductor layer; and
 a void formation step of forming the conductor non-formed portion and the void by forming a hole extending in the multilayer body downward direction from a top surface of the multilayer body formed in the multilayer body formation step.

20. The method for manufacturing the signal transmission line according to claim 19, wherein an open hole that penetrates from the top surface of the multilayer body to a bottom surface of the multilayer body is formed in the void formation step.

* * * * *